(12) United States Patent
Lu et al.

(10) Patent No.: US 11,204,835 B2
(45) Date of Patent: Dec. 21, 2021

(54) ERROR CORRECTING MEMORY SYSTEMS

(71) Applicant: SuperMem, Inc., San Diego, CA (US)

(72) Inventors: Yu Lu, San Diego, CA (US); Chieh-yu Lin, San Diego, CA (US)

(73) Assignee: SuperMem, Inc., San Diego, CA (US)

( * ) Notice: Subject to any disclaimer, the term of this patent is extended or adjusted under 35 U.S.C. 154(b) by 0 days.

(21) Appl. No.: 17/284,642

(22) PCT Filed: Oct. 11, 2019

(86) PCT No.: PCT/US2019/055963
§ 371 (c)(1),
(2) Date: Apr. 12, 2021

(87) PCT Pub. No.: WO2020/077283
PCT Pub. Date: Apr. 16, 2020

(65) Prior Publication Data
US 2021/0311827 A1 Oct. 7, 2021

Related U.S. Application Data

(60) Provisional application No. 62/745,204, filed on Oct. 12, 2018, provisional application No. 62/755,702, (Continued)

(51) Int. Cl.
*G06F 11/10* (2006.01)
*G11C 29/52* (2006.01)
*G11C 11/16* (2006.01)

(52) U.S. Cl.
CPC .......... *G06F 11/1068* (2013.01); *G11C 29/52* (2013.01); *G11C 11/161* (2013.01)

(58) Field of Classification Search
CPC .... G11C 29/52; G11C 11/161; G06F 11/1068
See application file for complete search history.

(56) References Cited

U.S. PATENT DOCUMENTS

2001/0047497 A1* 11/2001 Larson .................. G06F 11/106
714/42
2006/0212778 A1* 9/2006 Wheeler ............... G06F 11/106
714/764
(Continued)

FOREIGN PATENT DOCUMENTS

WO 2020077283 A1 4/2020

OTHER PUBLICATIONS

Cargnini et al. "Improving the Reliability of a FPGA Using Fault-Tolerance Mechanism Based on Magnetic Memory (MRAM)," IEEE, pp. 150-155, 2010 (Year: 2010).*
(Continued)

*Primary Examiner* — Guy J Lamarre
(74) *Attorney, Agent, or Firm* — Morrison & Foerster LLP

(57) ABSTRACT

Error correcting memory systems and methods of operating the memory systems are disclosed. In some embodiments, a memory system includes: a data memory; an ECC memory; and a data scrubbing circuit electrically coupled to the ECC memory and the data memory. The data scrubbing circuit may be configured to, in response to receiving a scrub data command, correct an error in the data memory. A code word length used to correct the error may be longer than a word length used during normal access of the data memory. In some embodiments, a memory system includes a first memory circuit associated with a first bit error rate and a second memory circuit associated with a second bit error rate. In some embodiments, a memory system includes an error correctable multi-level cell (MLC) array.

23 Claims, 11 Drawing Sheets

Related U.S. Application Data filed on Nov. 5, 2018, provisional application No. 62/886,967, filed on Aug. 15, 2019.

(56) References Cited

U.S. PATENT DOCUMENTS

| | | | |
|---|---|---|---|
| 2009/0006900 A1* | 1/2009 | Lastras-Montano | G11C 29/4401 714/42 |
| 2011/0289386 A1* | 11/2011 | Yang | G06F 11/106 714/764 |
| 2012/0110411 A1 | 5/2012 | Cheung et al. | |
| 2014/0281810 A1* | 9/2014 | Gifford | G11C 29/52 714/764 |
| 2016/0188409 A1 | 6/2016 | Pangal et al. | |
| 2016/0314038 A1* | 10/2016 | Russell | G06F 11/106 |
| 2017/0147421 A1* | 5/2017 | Wang | H03M 13/09 |
| 2017/0147432 A1* | 5/2017 | Suh | G06F 3/0619 |
| 2017/0161142 A1 | 6/2017 | Reed et al. | |
| 2017/0286216 A1* | 10/2017 | Kozhikkottu | G06F 11/1068 |
| 2017/0372798 A1* | 12/2017 | Hoya | G11C 29/42 |
| 2018/0314591 A1* | 11/2018 | Reed | G06F 11/106 |
| 2019/0164626 A1* | 5/2019 | Song | G11C 29/04 |
| 2020/0257454 A1* | 8/2020 | Davis | G06F 3/0635 |
| 2021/0149764 A1* | 5/2021 | Chung | G06F 11/1068 |

OTHER PUBLICATIONS

Caffrey et al. "On-orbit flight results from the reconfigurable cibola flight experiment satellite (CFESat)." In: 2009 17th IEEE Symposium on Field Programmable Custom Computing Machines. Apr. 7, 2009 (Apr. 7, 2009); 9 pgs; (Retrieved on Jan. 28, 2020 (Jan. 28, 2020) from https://permalink.lanl.gov/object/tr?what=info:lanl-repo/lareport/LA-UR-09-00369 entire document).

* cited by examiner

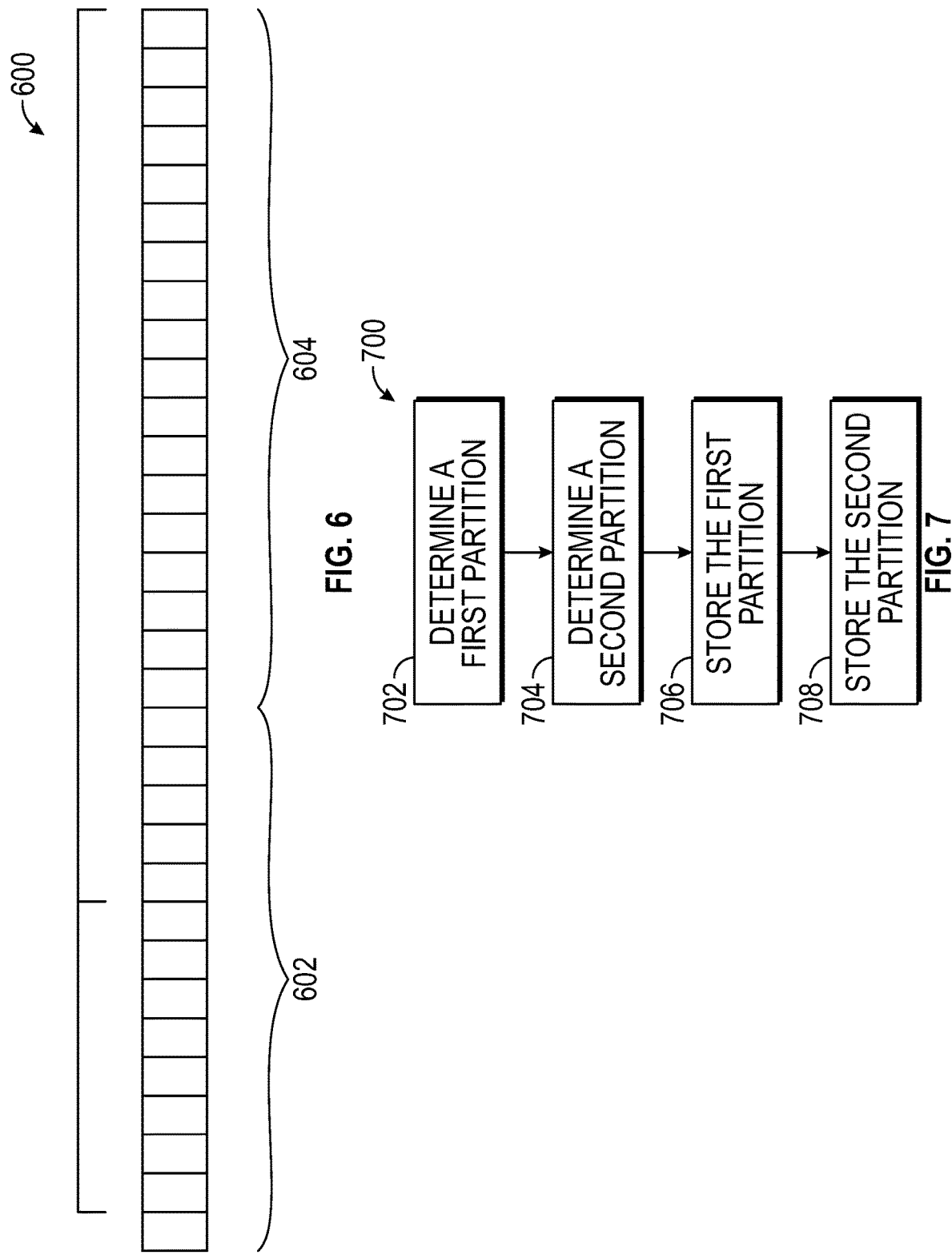

ERROR CORRECTING MEMORY SYSTEMS

CROSS REFERENCE TO RELATED APPLICATIONS

This Application is a national stage application under 35 U.S.C. § 371 of International Application No. PCT/US2019/055963, filed internationally on Oct. 11, 2019, which claims the benefit of U.S. Provisional Application No. 62/745,204, filed on Oct. 12, 2018, U.S. Provisional Application No. 62/755,702, filed on Nov. 5, 2018, and U.S. Provisional Application No. 62/886,967, filed on Aug. 15, 2019, the entire disclosures of which are herein incorporated by reference in their entireties and for all purposes.

FIELD

This disclosure generally relates to computing memory. More specifically, this disclosure relates to devices and method for computing memory error correction.

BACKGROUND

Magnetic-Random-Access-Memory (MRAM), Phase-Change-Memory (PCM), Resistive-Random-Access-Memory (RRAM), and Ferroelectric-Random-Access-Memory (FRAM) are some of the non-volatile memory technologies that may have faster programming and higher re-write endurance than FLASH. For example, high performance MRAM may be used in edge-AI applications, which may require complex data structure after model optimization.

To achieve high performance, a number of unique circuit challenges exist for non-volatile memory like MRAM. Particularly, the read performance may be limited by read-disturb error at higher voltage operation, and write performance may be limited by hard break down at even higher voltage operation. Another obstacle may be that higher level of error correction may be required to achieve long-term data retention at higher temperature or during higher temperature events. In these instances, a two-bit correcting circuit may be used, but the circuit may add additional delays to read and write operations.

Furthermore, some of these non-volatile RAM technologies and conventional volatile memory technologies may be sensitive to environmental disturbances. For example, data in DRAM is sensitive to high temperature exor ionizing radiation, and data in MRAM may be corrupted by high temperature or large magnetic field.

Power may be a major constraint for electronic device design, and memory devices may consume an increasing portion of the total power, as memory density continues to increase. Reducing memory power consumption may increase error rate for retaining data and for read and write operations.

Large area overhead may be required to achieve adequate error correction strength. For example, using the low-latency hamming code, five error correction code (ECC) bits may be required to protect an 8-bit word against a single bit error. As another example, larger blocks of data (e.g., 1024 bits or more) may be protected with less ECC check bits using the Bose, Chaudhuri, and Hocquenghem (BCH) code or low-density parity check (LDPC) code. But these ECC codes require more complex encoding and decoding operations, and may affect performance.

Multi-level cell (MLC) devices (such as floating gate or charge-trapping FLASH device, eDRAM capacitors, RRAM, PCM, analog memory) may be used to perform compute-in-memory operations by representing the matrix multiplicand with multiple states or a continuum of analog characteristics. However, most of these devices may exhibit drift during operation that may gradually change the value of the matrix multiplicand. If the device drifts beyond a threshold, it may be difficult for to simply "read and recover" and maintain a correct value over time.

SUMMARY

Disclosed herein are error correcting memory systems and methods of operating the memory systems. In some embodiments, a memory system includes: a data memory; an ECC memory; and a data scrubbing circuit electrically coupled to the ECC memory and the data memory. The data scrubbing circuit may be configured to, in response to receiving a scrub data command, correct an error in the data memory. A code word length used to correct the error may be longer than a word length used during normal access of the data memory. In some embodiments, a memory system includes a first memory circuit associated with a first bit error rate and a second memory circuit associated with a second bit error rate. In some embodiments, a memory system includes an error correctable multi-level cell (MLC) array.

In some embodiments, a memory system comprises: a data memory; an ECC memory; and a data scrubbing circuit electrically coupled to the ECC memory and the data memory.

In some embodiments, the data scrubbing circuit is configured to, in response to receiving a scrub data command, correct an error in the data memory.

In some embodiments, a code word length used to correct the error is longer than a word length used during normal access of the data memory In some embodiments, the data scrubbing circuit comprises a data buffer, a data scrubbing controller, an ECC encoding circuit, and an ECC decoding circuit.

In some embodiments, the data scrubbing circuit is configured to correct the error in the data memory while the data memory is concurrently accessed.

In some embodiments, the memory system further comprises an environmental disturbance sensor configured to detect an environmental condition, and wherein the data scrubbing circuit generates a scrub data command based on the detected environmental condition.

In some embodiments, the environmental condition includes at least one of a temperature and a magnetic field.

In some embodiments, the data scrubbing circuit is configured to detect change in known data and generate a scrub data command based on the detection of the change.

In some embodiments, the memory system further comprises a timer circuit configured to: track a time lapsed; and determine whether the time lapsed is greater than a timing threshold, and the scrub data command is generated in accordance with the determination that the time lapsed is greater than the timing threshold.

In some embodiments, the ECC memory includes a plurality of partitions, and the data memory includes a plurality of ranges of memory addresses, each partition corresponding to a range of memory addresses in the data memory.

In some embodiments, the ECC memory includes a partition having a number of ECC bits, and the number of ECC bits is based on an ECC encoding method associated with a data scrubbing algorithm.

In some embodiments, the ECC memory includes a set of registers, wherein: each register corresponds to an ECC code word, each ECC code word corresponds to a section in the data memory, and each register stores a state of the section.

In some embodiments, at least one selected from the data memory and the ECC memory comprises magnetic random-access memory (MRAM).

In some embodiments, at least one selected from the data memory and the ECC memory include a memory unit cell including a magnetic tunnel junction (MTJ) having a property selected from reduced dimension, reduced coercive field, reduced magnetic anisotropy, and reduced saturation magnetization compared to a memory unit cell having a bit error rate between $10^{-12}$ and $10^{-2}$.

In some embodiments, the MJT has two properties selected from reduced dimension, reduced coercive field, reduced magnetic anisotropy, and reduced saturation magnetization compared to a memory unit cell having a bit error rate between $10^{-12}$ and $10^{-2}$.

In some embodiments, the data memory includes static random-access memory (SRAM), dynamic random-access memory (DRAM), or embedded DRAM (eDRAM).

In some embodiments, the data scrubbing circuit or a host is configured to determine whether the data memory is protected, and the ECC memory is configured to: in accordance with a determination that the data memory is protected, store ECC check-bits; and in accordance with a determination that the data memory is not protected, store computing data.

In some embodiments, the data memory and the ECC memory are included in different memory circuits.

In some embodiments, the data memory and the ECC memory are included in a same memory circuit.

In some embodiments, the memory system is electrically coupled to a host device.

In some embodiments, the data memory and the ECC memory include a memory unit cell including a MTJ having a size between 20 nm and 200 nm and a MOS transistor having a width-to-length ratio between 1 and 200.

In some embodiments, the data scrubbing circuit is configured to: receive a protect command for data; and in response to receiving the protect command, for each data word in the data to be protected: identify an address for a data code word associated with the data word; determine, based on the address, whether the data word is in a data memory; in response to determining that the data word is in the data memory, read the data word from the data memory; in response to determining that the data word is not in the data memory: receive the data word; and write the data word to the data memory; perform ECC encoding computation on the data word; generate the data code word based on the ECC encoding computation; write the data code word to the data memory at the address; generate ECC check bits based on the ECC encoding computation; and write the generated ECC check bits to a corresponding partition in the ECC memory.

In some embodiments, the data scrubbing circuit is configured to: receive a scrub data command; in response to receiving the scrub data command, for each data word to be scrubbed: identify: a starting address for a data code word, and a corresponding ECC memory partition; read a data word associated with the starting address from a data memory; read ECC check bits associated with the corresponding ECC memory partition from an ECC memory; perform ECC decoding computation based on the data word and ECC check bits; determine whether the data word includes an error based on the ECC decoding computation; in response to determining that the data word includes the error, replace error bits with correctable error bits in the data word, wherein the data word including the correctable error bits is a scrubbed data word; in response to determining that the data word does not include the error, forgo replacing the error bits with the correctable error bits in the data word, wherein the data word is the scrubbed data word; determine whether the scrubbed data word is requested by a host; in response to determining that the scrubbed data is requested by the host, output the scrubbed data word to a memory controller electrically coupled to the host; and in response to determining that the scrubbed data is not requested by the host, forgo outputting the scrubbed data word to the memory controller.

In some embodiments, a method of operating a memory system, the memory system comprising: a data memory; an ECC memory; and a data scrubbing circuit electrically coupled to the ECC memory and the data memory, the method comprises: in response to receiving a scrub data command, correcting, using the data scrubbing circuit, an error in the data memory.

In some embodiments, a code word length used to correct the error is longer than a word length used during normal access of the data memory.

In some embodiments, the data scrubbing circuit comprises a data buffer, a data scrubbing controller, an ECC encoding circuit, and an ECC decoding circuit.

In some embodiments, the method further comprises concurrently accessing the data memory while correcting the error in the data memory.

In some embodiments, the method further comprises detecting an environmental condition, using an environmental disturbance sensor; and generating the scrub data command based on the detected environmental condition.

In some embodiments, the environmental condition includes at least one of a temperature and a magnetic field.

In some embodiments, the method further comprises detecting change in known data; and generating the scrub data command based on the detection of the change.

In some embodiments, the method further comprises tracking a time lapsed; determining whether the time lapsed is greater than a timing threshold, and generating the scrub data command in accordance with the determination that the time lapsed is greater than the timing threshold.

In some embodiments, the ECC memory includes a plurality of partitions, and the data memory includes a plurality of ranges of memory addresses, each partition corresponding to a range of memory addresses in the data memory.

In some embodiments, the ECC memory includes a partition having a number of ECC bits associated with a data scrubbing algorithm, the method further comprising performing an ECC encoding method using the number of ECC bits.

In some embodiments, the ECC memory includes a set of registers, wherein: each register corresponds to an ECC code word, each ECC code word corresponds to a section in the data memory, and each register stores a state of the section.

In some embodiments, at least one selected from the data memory and the ECC memory comprises magnetic random-access memory (MRAM).

In some embodiments, at least one selected from the data memory and the ECC memory include a memory unit cell including a magnetic tunnel junction (MTJ) having a property selected from reduced dimension, reduced coercive field, reduced magnetic anisotropy, and reduced saturation magnetization compared to a memory unit cell having a bit error rate between $10^{-12}$ and $10^{-2}$.

In some embodiments, the MJT has two properties selected from reduced dimension, reduced coercive field, reduced magnetic anisotropy, and reduced saturation magnetization compared to a memory unit cell having a bit error rate between $10^{-12}$ and $10^{-2}$.

In some embodiments, the data memory includes static random-access memory (SRAM), dynamic random-access memory (DRAM), or embedded DRAM (eDRAM).

In some embodiments, the method further comprises determining whether the data memory is protected; in accordance with a determination that the data memory is protected, storing ECC check-bits in the ECC memory; and in accordance with a determination that the data memory is not protected, store computing data in the ECC memory.

In some embodiments, the data memory and the ECC memory are included in different memory circuits.

In some embodiments, the data memory and the ECC memory are included in a same memory circuit.

In some embodiments, the memory system is electrically coupled to a host device.

In some embodiments, the data memory and the ECC memory include a memory unit cell including a MTJ having a size between 20 nm and 200 nm and a MOS transistor having a width-to-length ratio between 1 and 200.

In some embodiments, the method further comprises receiving a protect command for data; and in response to receiving the protect command, for each data word in the data to be protected: identifying an address for a data code word associated with the data word; determining, based on the address, whether the data word is in a data memory; in response to determining that the data word is in the data memory, reading the data word from the data memory; in response to determining that the data word is not in the data memory: receiving the data word from; and writing the data word to the data memory; performing ECC encoding computation on the data word; generating the data code word based on the ECC encoding computation; writing the data code word to the data memory at the address; generating ECC check bits based on the ECC encoding computation; and writing the generated ECC check bits to a corresponding partition in an ECC memory.

In some embodiments, the method further comprises in response to receiving the scrub data command, for each data word to be scrubbed: identifying: a starting address for a data code word, and a corresponding ECC memory partition; reading a data word associated with the starting address from a data memory; reading ECC check bits associated with the corresponding ECC memory partition from an ECC memory; performing ECC decoding computation based on the data word and ECC check bits; determining whether the data word includes an error based on the ECC decoding computation; in response to determining that the data word includes the error, replacing error bits with correctable error bits in the data word, wherein the data word including the correctable error bits is a scrubbed data word; in response to determining that the data word does not include the error, forgoing replacing the error bits with the correctable error bits in the data word, wherein the data word is the scrubbed data word; determining whether the scrubbed data word is requested by a host; in response to determining that the scrubbed data is requested by the host, outputting the scrubbed data word to a memory controller electrically coupled to the host; and in response to determining that the scrubbed data is not requested by the host, forgoing outputting the scrubbed data word to the memory controller.

In some embodiments, the memory system is included in one selected from an edge-AI system, a neural-network system in data centers, an internet-of-things system, an automotive electronics system, microcontroller system, a mobile communication system, a programmable computing system, a hardware security system, a telematics system, a biomedical electronics device, a robot, and a drone.

In some embodiments, a memory system comprises: a first memory circuit associated with a first bit error rate; a second memory circuit associated with a second bit error rate, wherein the first bit error rate is greater than the second bit error rate; and a data word stored in the first and second memory circuits, wherein: the data word includes a first partition associated with the first bit error rate and a second partition associated with the second bit error rate, the first partition of the data word is stored in the first memory circuit, and the second partition of the data word is stored in the second memory circuit.

In some embodiments, the memory system further comprises a data scrubbing circuit electrically coupled to the first and second memory circuits, wherein: the data scrubbing circuit controls the first memory circuit to reduce the first error rate to a third error rate, the data scrubbing circuit controls the second memory circuit to reduce the second error rate to a fourth error rate, and the reduction of the first bit error rate is greater than the reduction of the second bit error rate.

In some embodiments, the first memory circuit includes a first memory unit cell including a first magnetic tunnel junction (MTJ) having a first size and a first MOS transistor having a first channel width to channel length (W/L) ratio, the second memory circuit includes a second memory unit cell including a second MTJ having a second size and a second MOS transistor having a second W/L ratio, the first size is larger than the second size, and the first W/L ratio is larger than the second W/L ratio.

In some embodiments, the first memory circuit includes a memory unit cell including a MTJ having a size between 40 nm and 200 nm and a MOS transistor having a W/L ratio between 2 and 200.

In some embodiments, the second memory circuit includes a memory unit cell including a MTJ having a size between 20 nm and 100 nm and a MOS transistor having a W/L ratio between 1 and 100.

In some embodiments, the first memory circuit uses a first read voltage, a first sensing time, and a first word-line (WL) voltage, the second memory circuit uses a second read voltage, a second sensing time, and a second WL voltage, the first read voltage is greater than the second read voltage, the first sensing time is greater than the second sensing time, and the first WL voltage is greater than the second WL voltage.

In some embodiments, the first memory circuit uses a first write voltage, a first write time, and a first WL voltage, the second memory circuit uses a second write voltage, a second write time, and a second WL voltage, the first write voltage is greater than the second write voltage, the first write time is greater than the write sensing time, and the first WL voltage is greater than the second WL voltage.

In some embodiments, in a floating point format, the first partition includes a sign bit, exponent bits, and higher order part of mantissa bits.

In some embodiments, in an integer format, the first partition includes a sign bit and higher order bits.

In some embodiments, in a floating point format, the second partition includes a lower order part of mantissa bits.

In some embodiments, in an integer format, the second partition includes lower order bits.

In some embodiments, a method of operating a memory system, the memory system comprising a first memory circuit and a second memory circuit, the method comprises: determining a first partition of a data word to be stored in the memory system based on a first bit error rate; determining a second partition of the data word to be stored in the memory system based on a second bit error rate, the first bit error rate greater than the second bit error rate; storing the first partition of a data word in a first memory circuit; and storing the second partition of a data word in a second memory circuit, wherein: the first memory circuit is associated with the first bit error rate, and the second memory circuit is associated with the second bit error rate.

In some embodiments, the method further comprises controlling the first memory circuit to reduce the first error rate to a third error rate; and controlling the second memory circuit to reduce the second error rate to a fourth error rate, wherein the reduction of the first bit error rate is greater than the reduction of the second bit error rate.

In some embodiments, the first memory circuit includes a first memory unit cell including a first MTJ having a first size and a first MOS transistor having a first channel W/L ratio, the second memory circuit includes a second memory unit cell including a second MTJ having a second size and a second MOS transistor having a second W/L ratio, the first size is larger than the second size, and the first W/L ratio is larger than the second W/L ratio.

In some embodiments, the first memory circuit includes a memory unit cell including a MTJ having a size between 40 nm and 200 nm and a MOS transistor having a W/L ratio between 2 and 200.

In some embodiments, the second memory circuit includes a memory unit cell including a MTJ having a size between 20 nm and 100 nm and a MOS transistor having a W/L ratio between 1 and 100.

In some embodiments, the method further comprises using, in the first memory circuit, a first read voltage, a first sensing time, and a first WL voltage; and using, in the second memory circuit, a second read voltage, a second sensing time, and a second WL voltage, wherein: the first read voltage is greater than the second read voltage, the first sensing time is greater than the second sensing time, and the first WL voltage is greater than the second WL voltage.

In some embodiments, the method further comprises using, in the first memory circuit, a first write voltage, a first write time, and a first WL voltage; and using, in the second memory circuit, a second write voltage, a second write time, and a second WL voltage, wherein: the first write voltage is greater than the second write voltage, the first write time is greater than the write sensing time, and the first WL voltage is greater than the second WL voltage.

In some embodiments, in a floating point format, the first partition includes a sign bit, exponent bits, and higher order part of mantissa bits.

In some embodiments, in an integer format, the first partition includes a sign bit and higher order bits.

In some embodiments, in a floating point format, the second partition includes a lower order part of mantissa bits.

In some embodiments, in an integer format, the second partition includes lower order bits.

In some embodiments, the memory system is included in one selected from an edge-AI system, a neural-network system in data centers, an internet-of-things system, an automotive electronics system, microcontroller system, a mobile communication system, a programmable computing system, a hardware security system, a telematics system, a biomedical electronics device, a robot, and a drone.

In some embodiments, a memory system comprises: a data input; a multi-level cell (MLC) array; a write circuit electrically coupled to the MLC array and the data input; a Gray code-to-binary decoder circuit electrically coupled to the write circuit; a readout circuit electrically coupled to the MLC array; a binary-to Gray code encoder circuit electrically coupled to the readout circuit and the data input; a memory circuit configured to store ECC check bits; an ECC encoder electrically coupled to the memory circuit and binary-to Gray code encoder circuit; an ECC decoder electrically coupled to the memory circuit and the Gray code-to-binary encoder circuit and configured to output recovered data; and a data scrubbing controller configured to control data recovery in the memory system.

In some embodiments, the MLC array comprises a memory cell circuit having greater than two stable physical states.

In some embodiments, the memory cell circuit is one selected from floating gate FLASH cell organized as a NOR cell, floating gate FLASH cell organized as a NAND cell, charge-trapping FLASH cells organized as a NOR cell, charge-trapping FLASH cells organized as a NAND cell, phase-change memory (PCM) cell, and resistive-memory (RRAM) cell.

In some embodiments, the ECC encoder and decoder use in one selected from Hamming code, BCH code, Reed-Solomon code, and LDPC code.

In some embodiments, the memory circuit is located on a different integrated circuit than the MLC array.

In some embodiments, the memory circuit is located in a predetermined partition of the MLC array.

In some embodiments, the data scrubbing controller is configured to initiate a data scrubbing operation at predetermined intervals, in response to a detection of an environmental disturbance, or in response to receiving a command from a host.

In some embodiments, a method of data-scrubbing a MLC comprises: reading data from the MLC, the data represented in binary code or an analog value; converting the data to Gray code; reading corresponding check bit data from a memory circuit configured to store ECC check bits; computing a location of a correctable error in the data in Gray code; correcting the correctable error in the data in Gray code; converting the corrected data to binary code or a corrected analog value; and writing, with a write circuit, the corrected data over the data in the MLC.

In some embodiments, the MLC array comprises a memory cell circuit having greater than two stable physical states.

In some embodiments, the memory cell circuit is one selected from floating gate FLASH cell organized as a NOR cell, floating gate FLASH cell organized as a NAND cell, charge-trapping FLASH cells organized as a NOR cell, charge-trapping FLASH cells organized as a NAND cell, phase-change memory (PCM) cell, and resistive-memory (RRAM) cell.

In some embodiments, the method further comprises ECC encoding and decoding in one selected from Hamming code, BCH code, Reed-Solomon code, and LDPC code.

In some embodiments, the memory circuit is located on a different integrated circuit than the MLC array.

In some embodiments, the memory circuit is located in a predetermined partition of the MLC array.

In some embodiments, the method further comprises initiating a data scrubbing operation at predetermined intervals, in response to a detection of an environmental disturbance, or in response to receiving a command from a host.

In some embodiments, the memory system is included in one selected from an edge-AI system, a neural-network system in data centers, an internet-of-things system, an automotive electronics system, microcontroller system, a mobile communication system, a programmable computing system, a hardware security system, a telematics system, a biomedical electronics device, a robot, and a drone.

BRIEF DESCRIPTION OF THE DRAWINGS

FIG. 6 illustrates a data word partition, in accordance with an embodiment.

FIG. 7 illustrates a method of operating a memory system, in accordance with an embodiment.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

Figure 1:
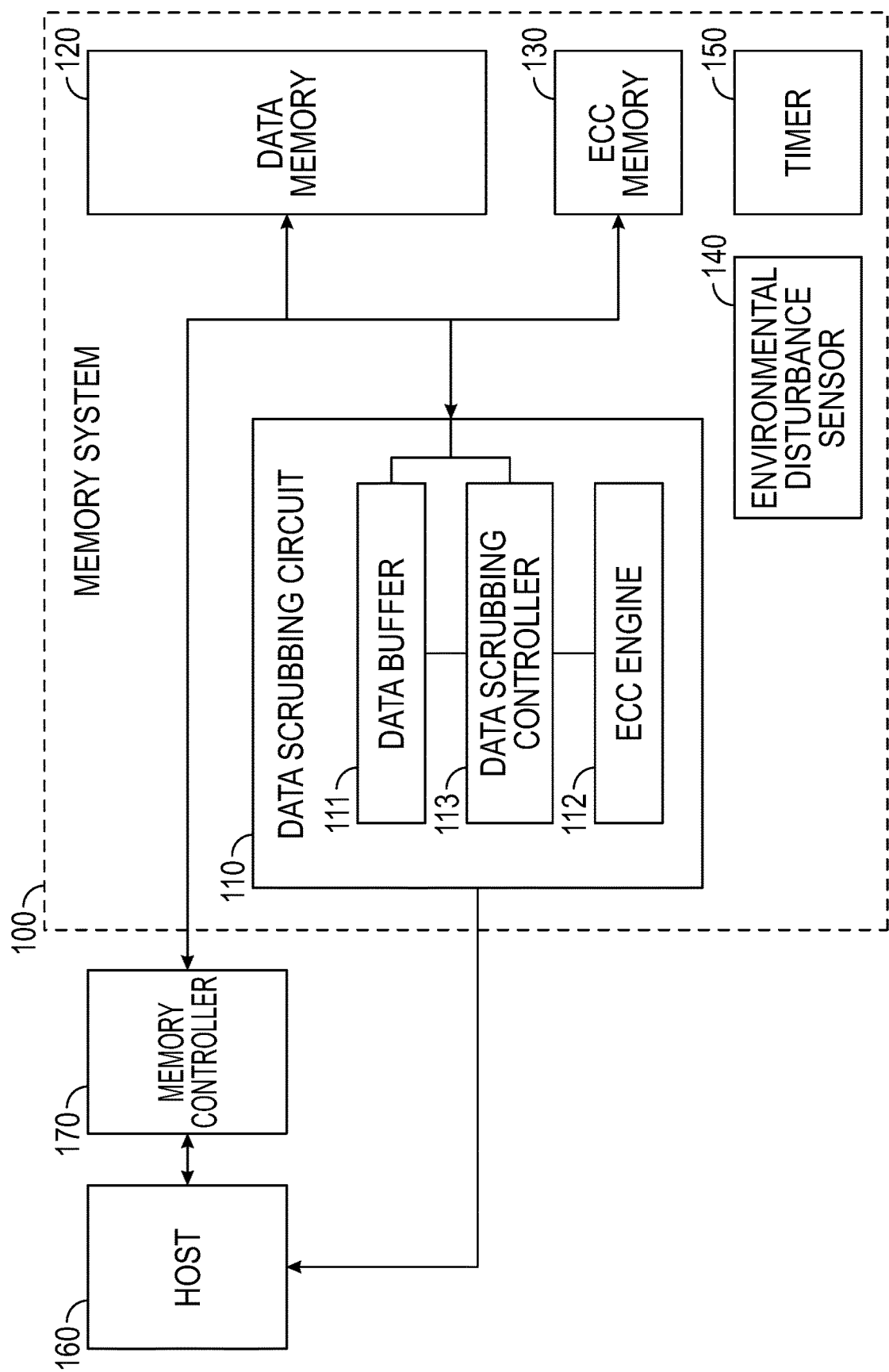
FIG. 1 illustrates a system including a memory system, in accordance with an embodiment.

FIG. 1 illustrates a memory system that includes a memory system 100. In some embodiments, the memory system 100 is electrically coupled to a host 160 and a memory controller 170. In some examples, the memory system 100 may include up to 1 GB of storage on a single die.

In some examples, the host 160 or the memory controller 170 may generate a scrub data command to initiate data scrubbing of data memory in the memory system 100 or generate a protect command to initiate protection of data memory in the memory system 100. In some examples, conditions that initiate the generation of the scrub data command may be programmable by the host 160 or the memory controller 170. In some examples, conditions that initiate the generation of the protect command may be programmable by the host 160 or the memory controller 170.

As an exemplary advantage, the memory system 100 may achieve high error-correction and data-scrubbing efficiency.

For example, exemplary embodiments of the memory system 100 may achieve two to four times power reduction without a substantial performance or area tradeoff, compared to memory systems that do not utilize the disclosed scrub data command, in response to specific conditions (e.g., a changing environment), as discussed below. Memory systems that do not utilize the disclosed scrub data command or the disclosed protect command may scrub or protect data when scrubbing or protection may not be necessary (e.g., the bit error rate sufficiently meets system requirements). Such memory systems may not be efficient (e.g., higher power consumption, reduced speed) because data is protected or scrubbed indiscriminately (e.g., only during power-up or power-down of a system). Due to the improved efficiency, in some examples, design requirements for MRAM using Spin-Transfer-Torque (STT) for write operations may be relaxed. As another example, data retention errors may be reduced using comparable MTJ manufacturing processes (e.g., device fabrication cost may be reduced). As yet another example, using the memory system 100, a MRAM device may linearly shrink up to 70% due to the relaxed requirements.

As used herein, a "scrub data command" is a command configured to initiate data scrubbing operation of the data memory. The scrub data command is generated and transmitted to the data scrubbing circuit in accordance with a determination that specific conditions are met. Such specific conditions may include conditions identified during normal operations, such as environmental condition, time lapse, and changes in known data (such as herein described). The normal operations include but are not limited to read and write operations, row activate and precharge operations, refresh operations, sector program and erase operations, defect repair operations, and wear-leveling operations. When these specific conditions are not met, the scrub data command is not generated to avoid unnecessary data scrubbing. For example, in a conventional memory system, data may be automatically scrubbed during power-on or power-off of the system. In the disclosed memory system, the data may only be scrubbed in response to receiving a scrub data command; powering-on or powering-off may not sufficiently cause the scrub data command to be generated.

As used herein a "protect command" is a command configured to initiate data protection of the data memory. The protect command is generated and transmitted to the data scrubbing circuit in accordance with a determination that specific conditions are met. When these specific conditions are not met, the protect command would not be generated to avoid unnecessary encoding. For example, in a conventional memory system, data may be protected by default. In the disclosed memory system, the data may only be protected in response to receiving a protect command.

For example, high performance MRAM included in memory system 100 may be efficiently protected or scrubbed and be more suitable for edge-AI (e.g., smart speaker, dash camera, drone, robot, autonomous vehicle) or neural-network applications, which require faster and more efficient memories (e.g., high bandwidth and low latency, high performance after model compression, high performance at high temperature, uninterrupted data access). Memory technologies that use non-deterministic physical process to program may suffer from high bit-error-rate (BER). Using the disclosed data scrubbing and protection methods, the memory system 100 may be advantageously enable more robust operations in a system such as an autonomous vehicle.

The memory system 100 may include a data scrubbing circuit 110, data memory 120, and an ECC memory 130. In some embodiments, the data memory 120 is a random-access memory (RAM) of a computer system. In some embodiments, the data memory 120 and the ECC memory 130 are non-volatile RAM.

In some embodiments, the data scrubbing circuit 110 performs data scrubbing without affecting read or write access of data memory 120. By performing data protection or data scrubbing concurrently with memory data access, memory errors (e.g., magnetic tunnel junction (MTJ) errors) may be reduced without adding latency in a critical path (e.g., scrubbing data at higher read and write speeds, scrubbing data without affecting nominal read and write speeds). For example, the reduced latency may allow the memory system to operate at TB/s bandwidth.

In some embodiments, the data scrubbing circuit 110 includes a pipelined ECC decoder circuit and local registers to track a current position within a code word associated with an ECC code. In some embodiments, the data memory 120 is divided into a plurality of sub-circuits, commonly referred to as a memory bank. Each memory bank can be configured to operate independently from other memory banks.

As an example, during a protection or data scrub operation, the memory system 100 may receive a data access command from a host (e.g., an edge-AI system). The data access command may be associated with an operation (e.g., read data, write data) on a data memory bank as the on-going data protect or data scrub operation is performed on a different memory bank. In this scenario, the on-going data protect or data scrub operation may proceed concurrently with the data access.

The data access command may be associated with an operation (e.g., read data, write data) on a data memory bank as the on-going data protect or data scrub operation is performed on the same memory bank. In this scenario, the data scrubbing controller 113 may pause the data protect or data scrub operation and release control of the data memory bank to the data access operation, such as a read operation or a write operation. After the data access operation is completed, the data scrubbing controller regains control of the data memory bank, and the paused data protect or data scrub operation resumes from the position at the ECC code word (e.g., at the corresponding address) prior to the interruption. In some examples, the data scrubbing controller 113 may perform data protect or data scrub operations on a different memory bank during this period.

In some examples, the data scrubbing circuit or the host (e.g., a central processing unit (CPU), a graphical processing unit (GPU), a system-on-a-chip (SoC), a programmable processor, an application special integrated circuit, or a microcontroller) is configured to determine whether the data memory is protected (e.g., the data scrubbing circuit or the host checks the registers in the ECC memory to see if a corresponding section is protected), and the ECC memory is configured to in accordance with a determination that the data memory is protected, store ECC check-bits and in accordance with a determination that the data memory is not protected, store computing data. For example, if the computing data in the data memory is not protected (e.g., ECC is not required), then the ECC memory may be used to store additional computing data. The data scrubbing circuit may be electrically coupled to the ECC memory and the data memory, as shown. As an exemplary advantage, a product may release data storage capacity of an ECC memory to a host system if no harsh environment is expected (e.g., a wearable electronic device that is not in a high temperature or high magnetic field environment).

In some examples, an ECC memory is configured to store computing data at a first time and in response to initiation of a protect command, the ECC memory is updated to store ECC check-bits. In these examples, the computing data may be moved to an empty area in the data memory, a different storage device in the system, or a remote storage device through data network. If none of these is possible, the memory system may send an error message to the host.

In some embodiments, the data memory and the ECC memory are included in different memory circuits. For example, the data memory and the ECC memory are included on different chips. In some embodiments, the data memory and the ECC memory are included in a same memory circuit. For example, the data memory and the ECC memory are included on a same chip. As another example, the data memory and the ECC memory are included in a same memory array; the data memory is included in a first portion of the array, and the ECC memory is included in a second portion of the array, for example.

By achieving the high error-correction and data-scrubbing efficiency benefits described herein, the memory unit cell can be configured to enhance rewrite endurance or performance, reduce power consumption, or a combination of these desirable traits. This may be achieved without reducing the error rate of the memory system (e.g., the high error-correction and data-scrubbing efficiencies of the disclosed system may at least offset the increased error rate associated with achieving these desirable traits).

For example, voltage levels of a write operation may be reduced by 5-50%, enhancing rewrite endurance of the memory cell and reducing power consumption without reducing the error rate of the memory system (e.g., sufficient write voltage or write time to mitigate device and circuit mismatches and/or stochastic STT effect without additional circuitry, reduced probability of breakdown during write operation). As another example, voltage levels of a read operation of the memory cell may be increased by 5-50% or a read time may be reduced by 5-50%, enhancing read performance without reducing the error rate of the memory system (e.g., sufficient read voltage or read time to mitigate device and circuit mismatches without additional circuitry, read disturb errors may be reduced). In some examples, read performance may improve to greater than 7 GB/s for a 1 MB array.

In some embodiments, the data memory may include magnetic random-access memory (MRAM). In some embodiments, the ECC memory may include MRAM. In some examples, at least one selected from the data memory and the ECC memory include a memory unit cell including a magnetic tunnel junction (MTJ) having at one property selected from reduced dimension, reduced coercive field, reduced magnetic anisotropy, and reduced saturation magnetization compared to a memory unit cell having a bit error rate between $10^{-12}$ and $10^{-2}$. In some examples, the data memory and the ECC memory include a memory unit cell including a MTJ having a size between 20 nm and 200 nm and a MOS transistor having a width-to-length ratio between 1 and 200.

In some embodiments, the data memory may include static random-access memory (SRAM), dynamic random-access memory (DRAM), or embedded DRAM (eDRAM). In some embodiments, the ECC memory may include SRAM, DRAM, or eDRAM. For example, the SRAM, DRAM, or eDRAM may include memory unit cells implemented in submicron (e.g., 28 nanometers and below) technologies having a bit error rate between $10^{-16}$ and $10^{-10}$. As such, the memory system 100 may advantageously allow scaling of SRAM, DRAM, or eDRAM technologies to smaller technology nodes without compromising power, area, or performance or soft error (e.g., read-disturb, write error, retention error) rates. Additionally, the SRAM, DRAM, or eDRAM at smaller technology nodes may be more radiation tolerant using the memory system 100.

In some embodiments, the data scrubbing circuit is configured to, in response to receiving a scrub data command, correct an error in the data memory. Memory systems that do not utilize the disclosed scrub data command may scrub data when scrubbing may not be necessary (e.g., the bit error rate sufficiently meets system requirements (e.g., usable bit error rate (UBER)). Such memory systems may not be efficient (e.g., higher power consumption, reduced speed) because data is scrubbed indiscriminately. By including a data scrubbing circuit configured to correct an error in the data memory in response to receiving a scrub data command, data can be scrubbed efficiently without unnecessary scrubbing.

In some embodiments, a code word length used to correct the error is longer than a word length used during normal access of the data memory. For example, words during normal access are a part of an ECC code word, such that the words are ECC protected. That is, the entire ECC code word may not be used during normal read operation (e.g., the normal access word portions are accessed). There are many ways to handle the write operation. For example, a code word length may have a length of 8192 bits, and a non-encoded word may have a length of 64 bits.

In some embodiments, the data memory 120 is divided into a plurality of pages, each page having a size of an ECC code word length (e.g., 8192 bits). When a host (e.g., an edge-AI system) sends a write command with a data word (e.g., a word having a length of 64 bits), the data scrubbing controller 113 would mark a destination page of the data word as "unprotected" using an extra bit (e.g., a page marker bit) included in each page. When the data scrubbing controller 113 initiates a data scrub operation on an "unprotected" page, the ECC check bit data in the corresponding ECC memory 130 would not be used immediately. Instead, the data scrubbing controller would first perform a protect operation to generate a set of ECC check bits corresponding to the new page data, and update the page marker bit from "unprotected" to "protected" before performing the data scrub operation.

As an exemplary advantage, longer code word length during error correction increases efficiency because smaller number of ECC check bits may be required to achieve a required UBER based on a raw bit error rate (RBER) of a memory unit cell. Therefore, size and cost of the memory system may be reduced.

In some embodiments, the data scrubbing circuit 110 includes a data buffer 111, ECC engine 112, and data scrubbing controller 113. The data scrubbing circuit may be further configured to use a code word associated with the code word length to correct an error in the data memory.

For example, when a data scrub command is initiated, all data words associated with the ECC code (e.g., an ECC page) are read out from the data memory 120, and the ECC check bits associated with the ECC page is read out from the ECC memory 130. The data words and the ECC check bits are sent to the ECC engine 112 through the data buffer 111. In some examples, the data buffer 111 may be configured as a First-In-First-Out (FIFO) memory. In some examples, normal data access (e.g., read requests from the host or the memory controller) of the read data words in data memory 120 may be paused while the ECC engine 112 is performing the ECC decoding operation. After the ECC page has been decoded by the ECC engine 112, correctable errors are detected. A number and locations of errors detected by the ECC engine may be sent to the data scrubbing controller 113. All detected errors would be corrected by writing the correct data (e.g., using the data scrubbing controller) back to corresponding locations in the data memory 120.

Figure 2:
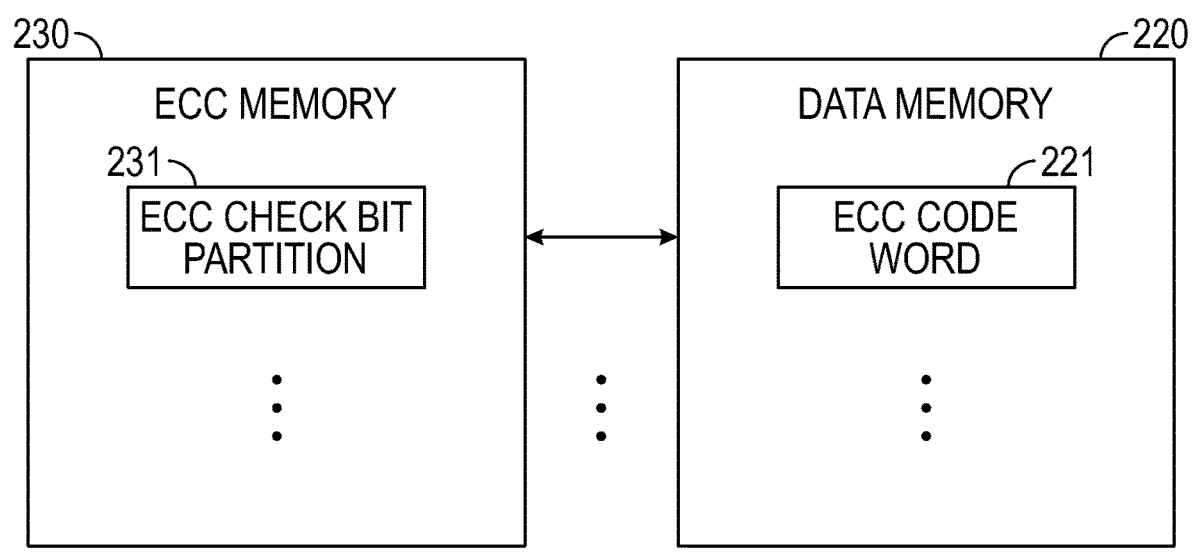
FIG. 2 illustrates a data memory and an ECC memory, in accordance with an embodiment.

FIG. 2 illustrates a data memory and an ECC memory, in accordance with an embodiment. In some embodiments, the ECC memory 230 includes a plurality of partitions and the data memory includes a plurality of ranges of memory addresses, each partition corresponding to a range of memory addresses in the data memory. For example, the ECC memory includes ECC check bit partition 231, and the data memory includes ECC code word 221. The ECC check bit partition 231 may correspond to a range of memory addresses associated with the ECC code word 221.

In some embodiments, the ECC check bit partition includes a number of ECC bits, and the number of ECC bits is based on an ECC encoding method associated with a data scrubbing algorithm. For example, the data scrubbing algorithm is one of Bose, Chaudhuri, and Hocquenghem (BCH) code and low-density parity check (LDPC) code. In an example, in a BCH (8640, 8192, 32) code, 448 ECC bits are associated with each ECC code word of 8192 bits (e.g., an ECC page) and are capable of correcting up to 32 errors in the ECC code word. As an exemplary advantage, approximately 5.2% area overhead may be required to implement this coding scheme, compared to 20% in systems that use a 2-bit ECC on a 64-bit word.

For example, an example of BCH encoding is described below. The BCH encoding and decoding may be performed using the data scrubbing circuit. An n-k dimensional state vector $R(t) = (r_{n-k-1(t)}, r_{n-k-1(t)}, \ldots, r_1(t), r_0(t))^T$, where $r_i(t)$ represents a state of the i-th reminder registers at time t, and u(t) represents a single-bit input at time t. R(t+1) may be expressed as:

$$R(t+1) = A \cdot R(t) + b \cdot u(t), \quad (1)$$

where matrix A is $$A = \begin{pmatrix} g_{n-k-1} & 1 & 0 & \ldots & 0 \\ g_{n-k-2} & 0 & 1 & \ldots & 0 \\ \vdots & \vdots & \vdots & \ddots & 0 \\ g_1 & 0 & 0 & \ldots & 1 \\ g_0 & 0 & 0 & \ldots & 0 \end{pmatrix} \quad (2)$$

And vector b is $$b = (g_{n-k-1}, g_{n-k-1}, \ldots, g_1, g_0)^T. \quad (3)$$

Recursively, R(t+p) may be calculated as $$R(t+p) = A^p \cdot R(t) + (A^{p-1}b, A^{p-2}b, \ldots, b) \cdot (u(t), u(t+1), \ldots, u(t+p-1))^T = A^p \cdot R(t) + B_p \cdot U_p(t) \quad (4)$$

In some embodiments, the ECC memory includes a set of registers. Each register corresponds to an ECC code word. Each ECC code word corresponds to a section in the data memory. Each register stores a state of the section. For example, the registers may be used to store a page marker bit.

In some embodiments, the data memory 220 is substantially similar to data memory 120, and the ECC memory 230 is substantially similar to ECC memory 130. Although the data memory and the ECC memory are illustrated using blocks, it is understood that the data memory and the ECC memory may be included in one or more memory arrays without departing from the scope of the disclosure.

In some embodiments, the memory system 100 includes an environmental disturbance sensor 140 configured to detect an environmental condition and generate the scrub data command based on the detected environmental condition. In some embodiments, the environmental condition includes at least one selected from temperature and magnetic field. In some embodiments, the environmental disturbance sensor is included in the data scrubbing controller (e.g., data scrubbing controller 113).

For example, the environmental disturbance sensor detects that the temperature reaches a threshold (e.g., a threshold temperature associated with a threshold bit error rate). In response to the detection of the temperature reaching the threshold, the data scrubbing controller generates the scrub data command to initiate data scrubbing of the data memory.

As another example, the environmental disturbance sensor detects that the magnetic field reaches a threshold (e.g., a threshold magnetic field intensity associated with a threshold bit error rate). In response to the detection of the magnetic field reaching the threshold, the data scrubbing controller generates the scrub data command to initiate data scrubbing of the data memory.

In some embodiments, the data scrubbing circuit is configured to detect change in known data (e.g., data that is known by the host or the memory system 100, predetermined data (e.g., checkerboard data with alternating 0s and 1s)) and generate the scrub data command based on the detection of the change. For example, a MRAM may be sensitive to a high magnetic field (e.g., a magnetic field greater than 100 to 1000 Oersted) and the high magnetic field may increase a probability of error associated with the known data.

As another example, a memory may be sensitive to high temperature (e.g., temperature greater than 150 degrees Celsius) and the high temperature may increase a probability of error associated with the memory. The environmental disturbance sensor may detect a temperature reaching a particular temperature threshold and initiate the generation of the scrub data command to correct potential error caused by the high temperature.

Although magnetic field and temperature are used as exemplary parameters for detecting an environmental condition that may increase an error probability associated with the memory, it is understood that the environmental disturbance sensor may detect other conditions. For example, the environmental disturbance sensor may detect ionizing radiation, which may cause charge-based memory circuits to lose data. In another example, the environmental disturbance sensor may detect mechanical stress excursions.

As exemplary advantage, the sensors and programmable closed loop control may manage memory (e.g., MRAM) behavior to mitigate effects of high temperature, temperature swing, magnetic field, or other disturbances. Therefore, higher or wider temperature operations and increased endurance may be advantageously achieved without additional compensation circuitries. For example, around room temperature, the environmental disturbance sensor may determine that no data scrubbing is needed (e.g., 0% of memory is used for scrubbing). At 125 Celsius, 2% of the data may be scrubbed for memory devices including MTJs that have a 60% intrinsic retention capability. In contrast, other system may require over 20% overhead to correct errors in similar situations.

In some embodiments, the memory system 100 includes a timer circuit 150 configured to track a time lapsed and determine whether the time lapsed is greater than a timing threshold, and the scrub data command is generated in accordance with a determination that the time lapsed is greater than the timing threshold. For example, the bit error rate (BER) of the memory increases proportionally with time (e.g., BER is cumulative), and the timing threshold corresponds to a threshold BER (e.g., system BER requirement). The timer circuits 150 keeps track of time lapse (e.g., between 1 µs and 100 hours) after a start time (e.g., the time when the ECC check bits are generated), and generation of the scrub data command may be initiated before an accumulated BER of the data memory exceed a level that cannot be corrected by the ECC method. In some embodiments, the timer circuit 150 is included in the data scrubbing controller (e.g., data scrubbing controller 113).

Figure 3:
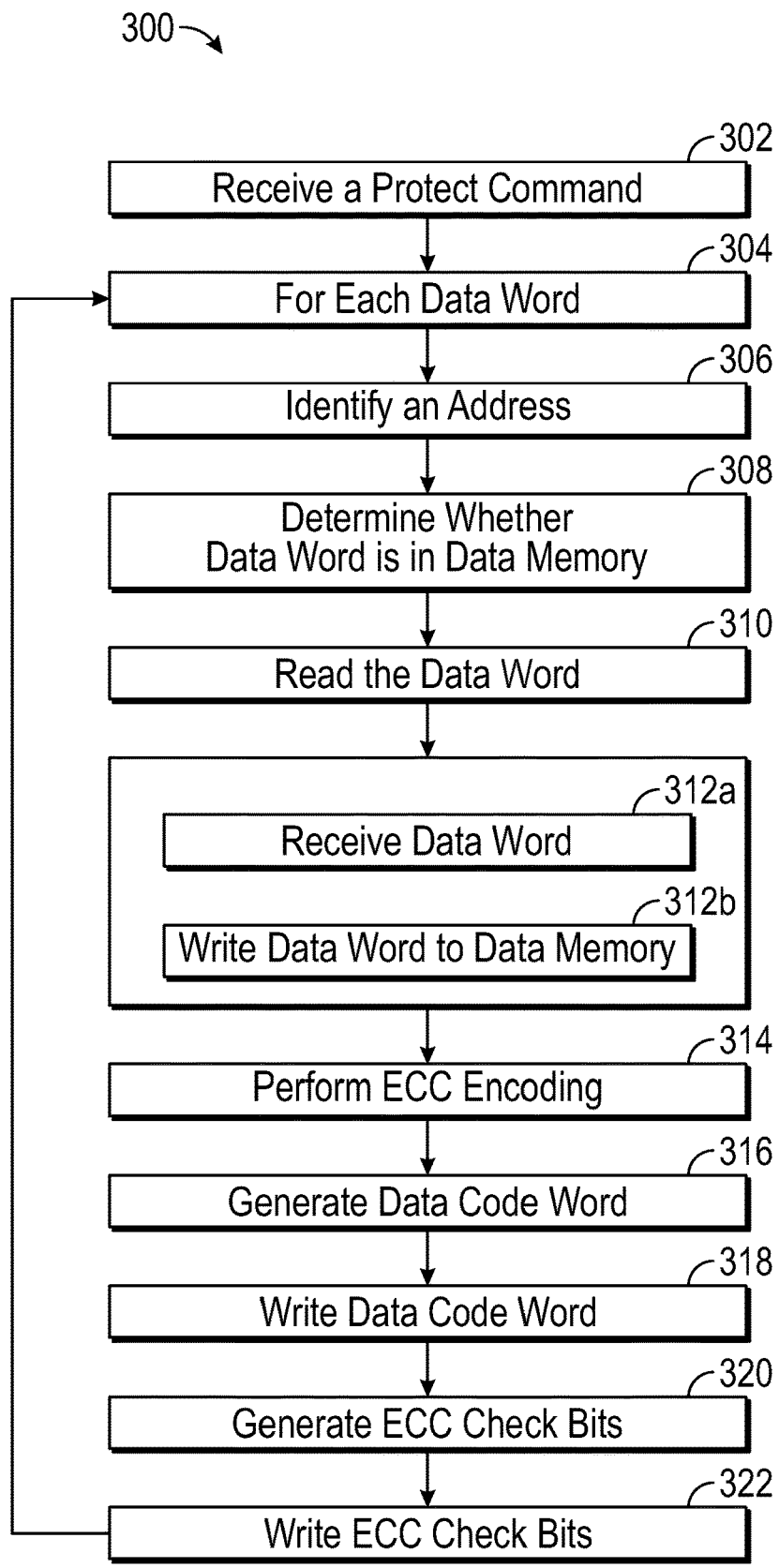
FIG. 3 illustrates a method of operating a memory system, in accordance with an embodiment.

FIG. 3 illustrates a method 300 of operating a memory system, in accordance with an embodiment. The method 300 includes step 302, receiving a protect command for data. For example, the protect command is received from the data scrubbing circuit 110, the host 160, or the memory controller 170. As another example, the protect command is received after a determination that the data memory requires protection (e.g., after a temperature, magnetic field, a timing threshold, a bit error rate threshold is reached).

As an exemplary advantage, the memory system may achieve high error-correction and data-scrubbing efficiency. For example, exemplary embodiments of the memory system 100 may achieve four times power reduction without a substantial performance or area tradeoff, compared to memory systems that do not utilize the disclosed scrub data command or the disclosed protect command. Memory systems that do not utilize the disclosed protect command may protect data when protection may not be necessary (e.g., the bit error rate sufficiently meets system requirements). Such memory systems may not be efficient (e.g., higher power consumption, reduced speed) because data is protected indiscriminately. For example, part or all of the data scrubbing circuit or the memory storing ECC check bits may be powered down when the protect command is not received. By using a protect data command, data can be protected efficiently without unnecessary protection.

In some embodiments, the method 300 is performed in response to receiving the protect command for each data word in the data to be protected (step 304). For example, each data word to be protected may be a portion of the data memory 120, such as a portion of the data memory having a more sensitive bit error rate. As another example, each data word to be protected may be the entirety of the data memory 120. In some embodiments, multiple words are protected sequentially. In some embodiments, multiple words are protected in parallel.

In some embodiments, the method 300 includes step 306, identifying an address for a data code word associated with the data word. For example, the protect command includes a range of addresses associated with data to be protected. As another example, an address associated with ECC code word 221 is identified by the host (e.g., the host determines portions of the memory that are critical to system functions).

In some embodiments, the method 300 includes step 308, determining, based on the address, whether the data word is in a data memory. For example, the protect command includes a bit indicating whether the data word is in the data memory. As another example, the data scrubbing circuit 110 determines whether the data word to be protected is stored in the data memory 120.

In some embodiments, the method 300 includes step 310, in response to determining that the data word is in the data memory, reading the data word from the data memory. For example, the read data is stored in a buffer memory. As another example, the data scrubbing circuit 110 determines that the data word to be protected is stored in the data memory 120, the data word to be protected is read form the data memory 120.

In some embodiments, the method 300 includes step 312, in response to determining that the data word is not in the data memory, receiving the data word (step 312a) and writing the data word to the data memory (step 312b). For example, the data scrubbing circuit 110 determines that the data word is not stored in the data memory 120, the data word is written to the data memory 120. In some embodiments, the data word to be written and protected is provided by the host 160.

In some embodiments, the method 300 includes step 314, performing ECC encoding computation on the data word. For example, based on a data scrubbing algorithm, the data word to be protected is encoded based on ECC encoding computation associated with the data scrubbing algorithm.

In some embodiments, the method 300 includes 316, generating the data code word based on the ECC encoding computation. For example, based on the ECC encoding computation, an ECC code word 221 is generated.

In some embodiments, the method 300 includes 318, writing the data code word to the data memory at the address. For example, the ECC code word 221 is written to the data memory 220 at the address.

In some embodiments, the method 300 includes step 320, generating ECC check bits based on the ECC encoding computation. For example, based on the ECC encoding computation, ECC check bits associated with ECC check bit partition 221 is generated.

In some embodiments, the method 300 includes step 322, writing the generated ECC check bits to a corresponding partition in an ECC memory. For example, the ECC check bits are written to the ECC check bit partition 221. In some embodiments, after the data memory are protected based on the protect command, a completion signal is sent to notify the host.

In some embodiments, the method 300 is performed prior to packaging operations of an integrated circuit to protect data written into the memory of the integrated circuit. As an exemplary advantage, memory systems using method 300 may be better configured for long-term storage or during standard packaging process (e.g., 260 C, 90 seconds). For example, data stored in non-volatile memory, such as MRAM and PCM, may have a high error rate after the packaging operations.

In some embodiments, the method 300 is performed after a long storage of an integrated circuit to protect the data written into the memory of the integrated circuit. The generated ECC check bits can be used to remove errors accumulated during the storage period to enhance the data retention specification of the product.

Figure 4:
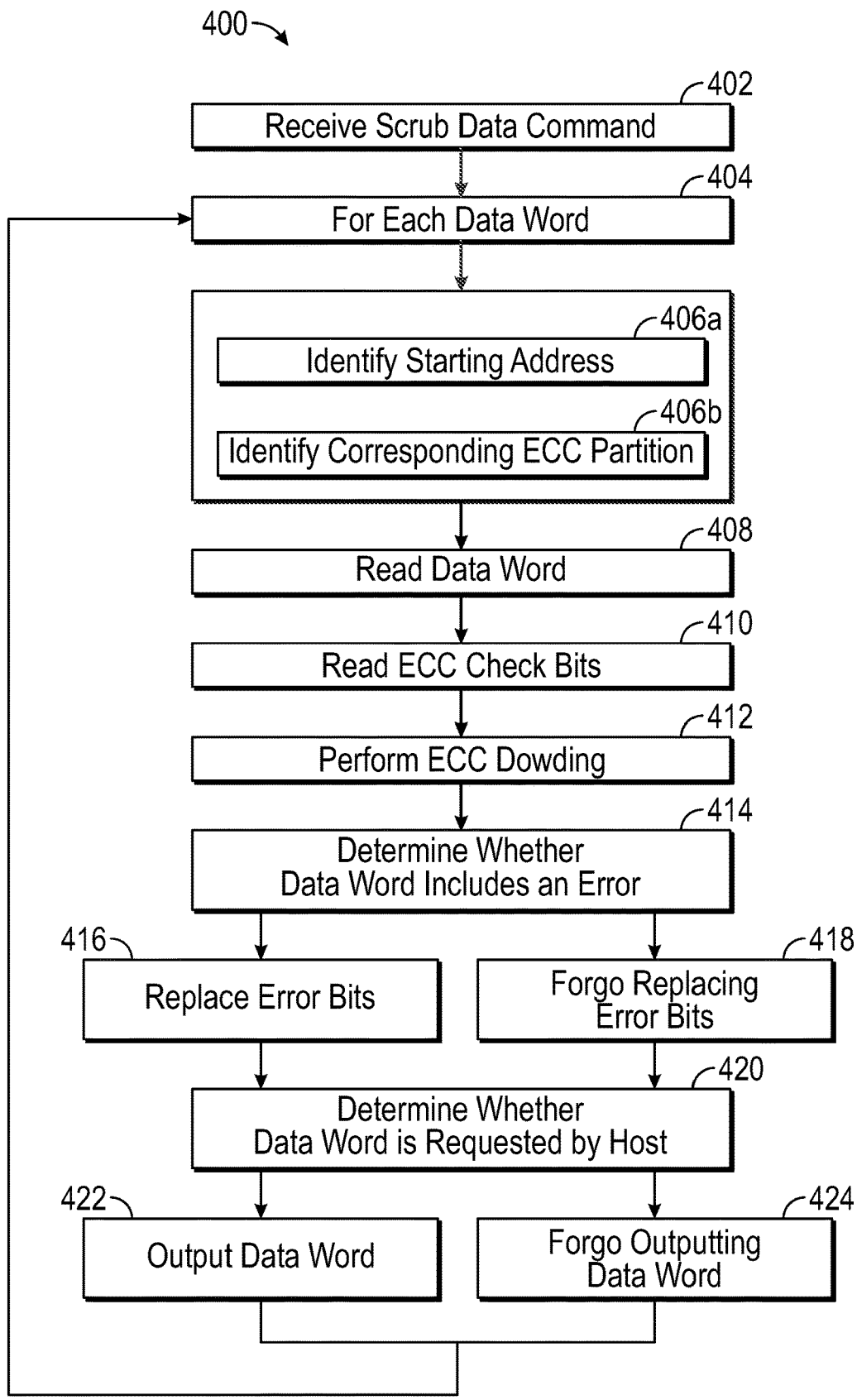
FIG. 4 illustrates a method of operating a memory system, in accordance with an embodiment.

FIG. 4 illustrates a method 400 of operating a memory system, in accordance with an embodiment. The method 400 includes step 402, receiving a scrub data command. For example, the scrub data command is received from the data scrubbing circuit 110, the host 160, or the memory controller 170. As another example, the scrub data command is received from the data scrubbing controller after a threshold (e.g., a temperature, magnetic field, a timing threshold, a bit error rate threshold) is reached.

As an exemplary advantage, the memory system may achieve high error-correction and data-scrubbing efficiency. For example, exemplary embodiments of the memory system 100 may achieve four times power reduction without a substantial performance or area tradeoff, compared to memory systems that do not utilize the disclosed scrub data command, in response to specific conditions, as discussed. Memory systems that do not utilize the disclosed scrub data command may scrub or protect data when scrubbing may not be necessary (e.g., the bit error rate sufficiently meets system requirements). Such memory systems may not be efficient (e.g., higher power consumption, reduced speed) because data is scrubbed indiscriminately. For example, part or all of the data scrubbing circuit or the memory storing ECC check bits may be powered down when the scrub data command is not received. By using a scrub data command, data can be scrubbed efficiently without unnecessary scrubbing.

In some embodiments, the method 400 is performed, in response to receiving the scrub data command, for each data word to be scrubbed (step 404). For example, the each data word to be scrubbed may be a portion of the data memory 120, such as a portion of the data memory having a more sensitive bit error rate. As another example, the each data word to be scrubbed may be the entirety of the data memory 120. In some embodiments, multiple word to be scrubbed are scrubbed sequentially. In some embodiments, multiple word to be scrubbed are scrubbed in parallel.

In some embodiments, the method 400 includes step 406, identifying: a starting address for a data code word (step 406a) and a corresponding ECC memory partition (step 406b). For example, the scrub data command includes addresses associated with data to be scrubbed. As another example, an address associated with ECC code word 221 and ECC check bit partition 231 are identified by the host (e.g., the host determines portions of the memory that are critical to system functions).

In some embodiments, the method 400 includes step 408, reading a data word associated with the starting address from a data memory. For example, the read data is stored in a buffer memory. As another example, a data word associated with the data code word is read from the data memory.

In some embodiments, the method 400 includes step 410, reading ECC check bits associated with the corresponding ECC memory partition from an ECC memory. For example, ECC check bits associated with the ECC check bit partition 231 is read from the ECC memory 230.

In some embodiments, the method 400 includes step 412, performing ECC decoding computation based on the data word and ECC check bits. For example, based on a data scrubbing algorithm, an ECC decoding computation is performed, by the ECC engine 112, based on the data word and the ECC check bits associated with the ECC check bit partition 231.

In some embodiments, the method 400 includes step 414, determining whether the data word includes an error based on the ECC decoding computation. For example, based on the data scrubbing algorithm and the ECC decoding computation, the ECC engine 112 determines whether the data word includes an error.

In some embodiments, the method 400 includes step 416, in response to determining that the data word includes the error, replacing error bits with correctable error bits in the data word, wherein the data word including the correctable error bits is a scrubbed data word. For example, the ECC engine 112 determines that the data word includes an error, and the data word includes correctable error bits. In response, the correctable error bits of the data word are replaced and corrected, and the corrected data word is a scrubbed data word.

In some embodiments, the method 400 includes step 418, in response to determining that the data word does not include the error, forgoing replacing the error bits with the correctable error bits in the data word, wherein the data word is the scrubbed data word. For example, the ECC engine 112 determines that the data word does not include an error, and in response, no bit in the data word is replaced.

In some embodiments, the method 400 includes step 420, determining whether the scrubbed data word is requested by a host. For example, a request by the host 160 is a request for data from a processor of a computing system that includes the memory system 100 and the host 160.

In some embodiments, the method 400 includes step 422, in response to determining that the scrubbed data is requested by the host, outputting the scrubbed data word to a memory controller electrically coupled to the host. For example, in response to determining (e.g., by the memory controller) that the request for the data is made by the host, the scrubbed data word is outputted to the memory controller and provided to the host and resides in the data memory.

In some embodiments, the method 400 includes step 424, in response to determining that the scrubbed data is not requested by the host, forgoing outputting the scrubbed data word to the memory controller. For example, in response to determining (e.g., by the memory controller) that the request for the data is not made by the host, the scrubbed data word resides in the data memory without being outputted to the memory controller. In some embodiments, after the data memory are scrubbed based on the scrub data command, a completion signal is sent to notify the host.

Different parts of data word may have different sensitivities to error. For example, an error in the Most-Significant-Bit (MSB) of an integer would result in more undesired consequences associated with the represented numerical value than an error in the lower order bits. Additionally, many modern computing applications such as machine learning and video and image processing are intrinsically error tolerant; enforcing a conservative error correction scheme on the entire system may not be necessary. However, conventional memory circuits may be designed to have a same error rate for all parts of the same data word. In these conventional memory circuits, power and area may be wasted by using lower error-tolerant memory circuit to store the more error-tolerant data.

Figure 5:
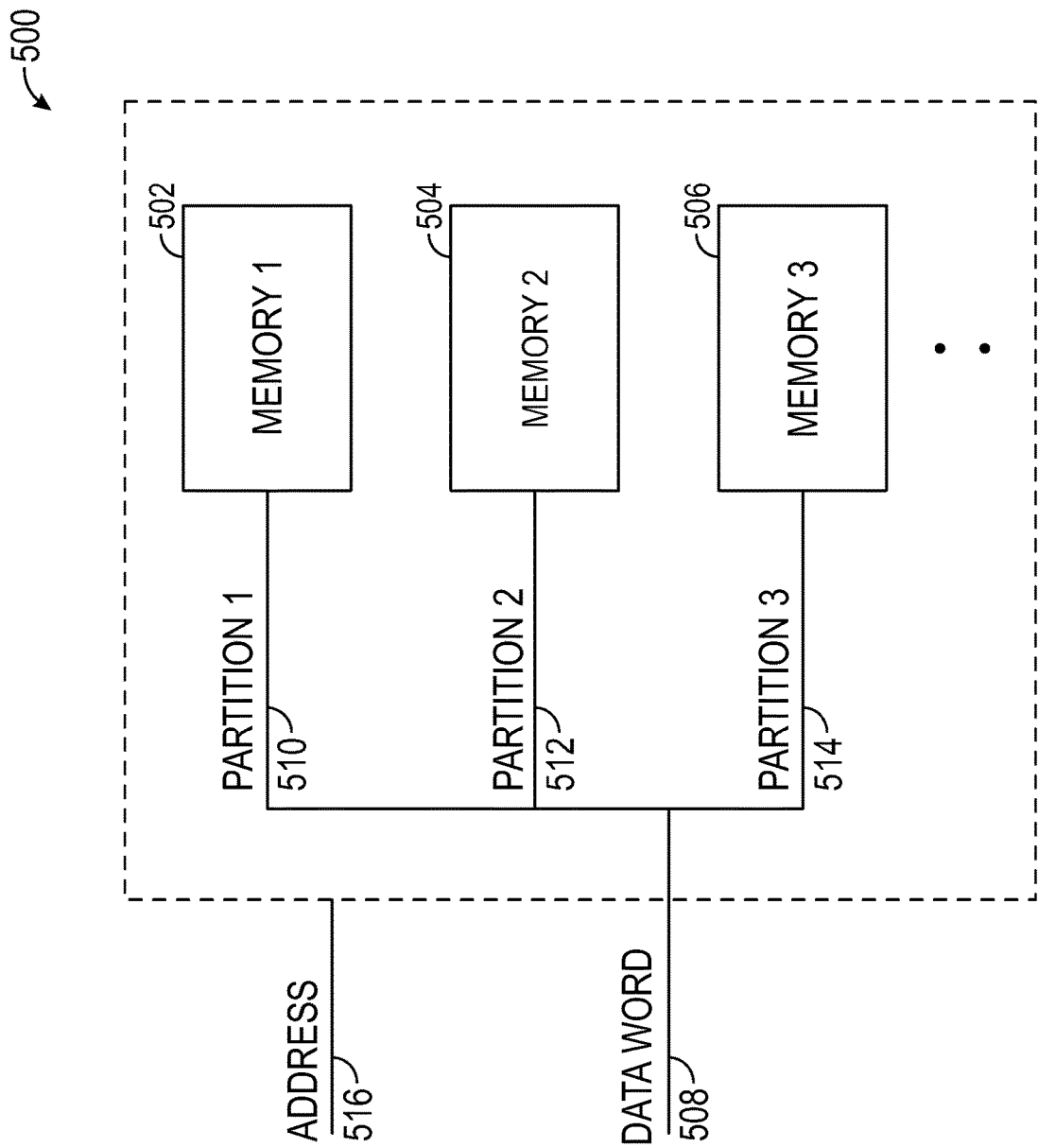
FIG. 5 illustrates a memory system, in accordance with an embodiment.

FIG. 5 illustrates a memory system 500, in accordance with an embodiment. In some embodiments, the memory system 500 is included in memory system 100. In some embodiments, the memory system 500 may be included in a machine learning or video or imagine processing system.

In some embodiments, the memory system 500 includes a first memory circuit 502 and a second memory circuit 504. The first memory circuit 502 may be associated with a first bit error rate. The second memory circuit 504 may be associated with a second bit error rate, and the first bit error rate may be greater than the second bit error rate. For example, the first bit error rate is between $10^{-16}$ and $10^{-12}$, and the second bit error rate is between $10^{-12}$ and $10^{-6}$.

In some embodiments, the first memory circuit 502 includes a data protection circuit such as an error-correction-coding circuit, data scrubbing circuit, redundancy circuit, or a combination of these circuits to reduce the first error rate to a third error rate. For example, a system may not tolerate a portion of data having the first error rate; the portion of data may be stored in the first memory circuit to reduce the first error rate to the third error rate to meet system requirements. In some embodiments, the first memory circuit 502 includes circuits configured to verify data after a write operation and reduce error rate, or circuits configured to prevent bit flip and reduce active power.

In some embodiments, the second memory circuit 504 include data protection circuit such as an error-correction-coding circuit, data-scrubbing circuit, redundancy circuit, or a combination of these circuits to reduce the error rate from the second error rate to a fourth error rate. In some embodiments, the second memory circuit 504 includes circuits configured to verify data after a write operation and reduce error rate, or circuits configured to prevent bit flip and reduce active power. In some embodiments, these circuits included in the second memory circuit 504 may consume less power and have a smaller area compare to the counterpart circuits in the first memory circuit 502.

In some embodiments, a data word 508 is stored in the first and second memory circuits. The data word 508 may include a first partition 510 associated with the first bit error rate and a second partition 512 associated with the second bit error rate. The first partition 510 of the data word 508 may be stored in the first memory circuit 502, and the second partition 512 of the data word 508 may be stored in the second memory circuit 504.

In some embodiments, the size of each partition is determined by the host (e.g., host 160). For example, for an 8-bit signed integer data, the host may determine to store the sign bit and the three most significant bits in the first partition associated with a lower bit error rate and store the four least significant bits in the second partition associated with a higher bit error rate. The significance of a bit may be determined by numerical format used by a software and the results may be communicated to the host. For example, an order from most significant to the least significant bits may be: sign bits, exponent bits, MSB to LSB in the mantissa.

In some embodiments, the size of each partition updates in response to changing conditions. For example, the size of each partition may be updated based on magnetic field and temperature conditions affecting the memory circuits. As another example, a partition in the first memory circuit may be determined to be no longer critical, and the partition may be moved to the second memory circuit.

The data word 508 may be associated with an address 516. In some embodiments, the address 516 corresponds to locations in the memory circuits where partitions are stored. The data word may be physically stored in different partitions, but to a user of the memory system 500 (e.g., host, memory controller), the data word appears to be stored in one location associated with the address 516.

In some embodiments, the memory system includes a third memory circuit 506. The data word 508 may include a third partition 514, and the third partition may be stored in the third memory circuit 506. The data word 508 may not include a third partition, and the data word 508 may be stored in the first and second memory circuits.

Although embodiments including two and three memory circuits and two and three partitions are described, it is understood that the memory system may include more or less memory circuits and the data word may include more or less partitions stored in respective memory circuits, without departing from the scope of the disclosure.

In some embodiments, the memory system 500 includes a data scrubbing circuit 516 electrically coupled to the first and second memory circuits. The data scrubbing circuit 516 may control the first memory circuit 502 to reduce the first error rate to a third error rate and may control the second memory circuit 504 to reduce the second error rate to a fourth error rate. In some embodiments, the reduction of the first bit error rate is greater than the reduction of the second bit error rate. For example, the third error rate is between $10^{-20}$ and $10^{-16}$, and the fourth error is between $10^{-16}$ and $10^{-10}$. In some embodiments, the data scrubbing circuit 516 and other processing circuits are on a same chip as the memory circuits. In some embodiments, the data scrubbing circuit 516 and other processing circuits are on a different chip than the memory circuits.

As an exemplary advantage, power and area may be reduced. For example, more resources would be appropriately directed to partitions having higher bit error rates or higher error sensitivities (e.g., critical parts of the memory) while less resources would be appropriately directed to partitions having lower bit error rates or lower error sensitivities (e.g., resources would not be wasted for partitions having lower bit error rates or lower error sensitivities); thereby saving power and reducing area of error correcting circuitry. As another example, computing applications such as neural-network applications, machine learning, and video or image processing system may be error tolerant, and some parts of the data may be less sensitive to errors. By partitioning parts of the data having less error sensitivities, power and area of the memory circuit can be reduced.

As another exemplary advantage, in large numerical data such as neural network parameters, bits within a data word based on their error sensitivity and design memory system can be partitioned accordingly and efficiently without using unnecessary computing resources.

In some embodiments, the first memory circuit 502 includes a first memory unit cell including a first magnetic tunnel junction (MTJ) having a first size and a first MOS transistor having a first channel width to channel length (W/L) ratio. The second memory circuit 604 includes a second memory unit cell including a second MTJ having a second size and a second MOS transistor having a second W/L ratio. The first size is larger than the second size, and the first W/L ratio is larger than the second W/L ratio.

For example, the first memory circuit includes a memory unit cell including a MTJ having a size between 40 nm and 200 nm and a MOS transistor having a W/L ratio between 2 and 200. As another example, wherein the second memory circuit includes a memory unit cell including a MTJ having a size between 20 nm and 100 nm and a MOS transistor having a W/L ratio between 1 and 100.

As an exemplary advantage, area may be reduced. For example, more area (e.g., larger devices having lower error rates) would be appropriately directed to partitions having higher bit error rates or higher error sensitivities (e.g., critical parts of the memory) while less area (e.g., smaller devices having lower error rates) would be appropriately directed to partitions having lower bit error rates or lower error sensitivities (e.g., area would not be wasted for partitions having lower bit error rates or lower error sensitivities); thereby reducing area of the memory circuits. As another example, computing applications such as machine learning and video or image processing system may be error tolerant, and some parts of the data may be less sensitive to errors. By partitioning parts of the data having less error sensitivities, area of the memory circuit can be reduced.

In some embodiments, the first memory circuit 502 uses a first read voltage, a first sensing time, and a first word-line (WL) voltage, and the second memory 504 circuit uses a second read voltage, a second sensing time, and a second WL voltage. The first read voltage is greater than the second read voltage. The first sensing time is greater than the second sensing time. The first WL voltage is greater than the second WL voltage.

For example, the first a read voltage is in the range between 50 mV to 300 mV, or the first sensing time is in the range between 3 ns to 500 ns or both to reduce sensing error rate. The first WL voltage may be in the range between 100% to 200% of the rated gate voltage for an access transistor during a read operation. The second read voltage may be in the range between 30 mV to 100 mV, or the second sensing time may be in the range of 2 ns to 100 ns or both to reduce read out power consumption. The second WL voltage may be in the range between 70% to 150% of the rated gate voltage for an access transistor during the read operation.

In some embodiments, the first memory circuit 502 uses a first write voltage, a first write time, and a first word-line (WL) voltage, and the second memory 504 circuit uses a second write voltage, a second write time, and a second WL voltage. The first write voltage is greater than the second write voltage. The first write time is greater than the second write time. The first WL voltage is greater than the second WL voltage.

For example, the first write voltage is in the range between 500 mV to 1500 mV, or longer write time is in the range of 5 ns to 1000 ns, or both to reduce write error rate. The first WL voltage may be in the range of between 100% to 300% of the rated gate voltage for an access transistor during a write operation. The second write voltage may be in the range between 300 mV to 1000 mV, or shorter write time may be in the range between 2 ns to 500 ns, or both to reduce write power consumption. The second WL voltage may be in the range between 70% to 200% of the rated gate voltage for an access transistor during the write operation.

As an exemplary advantage, power may be reduced. For example, more resources (e.g., higher voltages, longer sensing/write times) would be appropriately directed to partitions having higher bit error rates or higher error sensitivities (e.g., critical parts of the memory) while less resources (e.g., higher voltages, longer sensing/write times) appropriately directed to partitions having lower bit error rates or lower error sensitivities (e.g., resources would not be wasted for partitions having lower bit error rates or lower error sensitivities); thereby saving read and/or write power. As another example, computing applications such as machine learning and video or image processing system may be error tolerant, and some parts of the data may be less sensitive to errors. By partitioning parts of the data having less error sensitivities, power can be reduced.

FIG. 6 illustrates a data word partition, in accordance with an embodiment. In some embodiments, the data word 600 includes partitions 602 and 604. For example, the data word 600 includes partitions of a standard single-precision format into more error-sensitive bits (MESB) (e.g., partition 602) and less error-sensitive bits (LESB) (e.g., partition 604). In some embodiments, the partitions 602 and 604 are substantially similar to partitions 510 and 512, and the data word 600 may be stored in the memory system 500. In some embodiments, the length of data word 600 is a power of two.

In some examples, the data word 600 is in a floating point format. The first partition 602 includes a sign bit, exponent bits, and higher order part of mantissa bits, and the second partition 604 includes a lower order part of mantissa bits. In some examples, the data word 600 is in an integer format, the first partition 602 includes a sign bit and higher order bits, and the second partition 604 includes lower order bits.

Although embodiments including two partitions are described with respect to data word 600, it is understood that the data word 600 may include more partitions, each partition associated with a bit error rate, without departing from the scope of the disclosure.

FIG. 7 illustrates a method of operating a memory system, in accordance with an embodiment. In some embodiments, the method 700 includes step 702, determining a first partition of a data word to be stored in the memory system based on a first bit error rate. For example, partition 602 is determined (by e.g., the host depending on system error tolerance associated with the data, depending on the numeral format of the data word 600) to be more sensitive to error (e.g., having a higher error rate).

In some embodiments, the method 700 includes step 704, determining a second partition of the data word to be stored in the memory system based on a second bit error rate, the first bit error rate greater than the second bit error rate. For example, partition 604 is determined (by e.g., the host) to be less sensitive to error compared to the first partition (e.g., having a lower error rate compared to the first partition).

In some embodiments, the method 700 includes step 706, storing the first partition of a data word in a first memory circuit. For example, the first partition 602 is stored in first memory circuit 502. The first memory circuit 502 may be configured to correct data having the first bit error rate.

In some embodiments, the method 700 includes step 708, storing the second partition of a data word in a second memory circuit. For example, the second partition 604 is stored in second memory circuit 504. The second memory circuit 504 may be configured to correct data having the second bit error rate.

In some embodiments, the first memory circuit is associated with the first bit error rate, and the second memory circuit is associated with the second bit error rate. For example, memory circuit 502 is associated with a first bit error rate, memory circuit 504 is associated with a second bit error rate, and the second bit error rate is greater than the first bit error rate.

Figure 8:
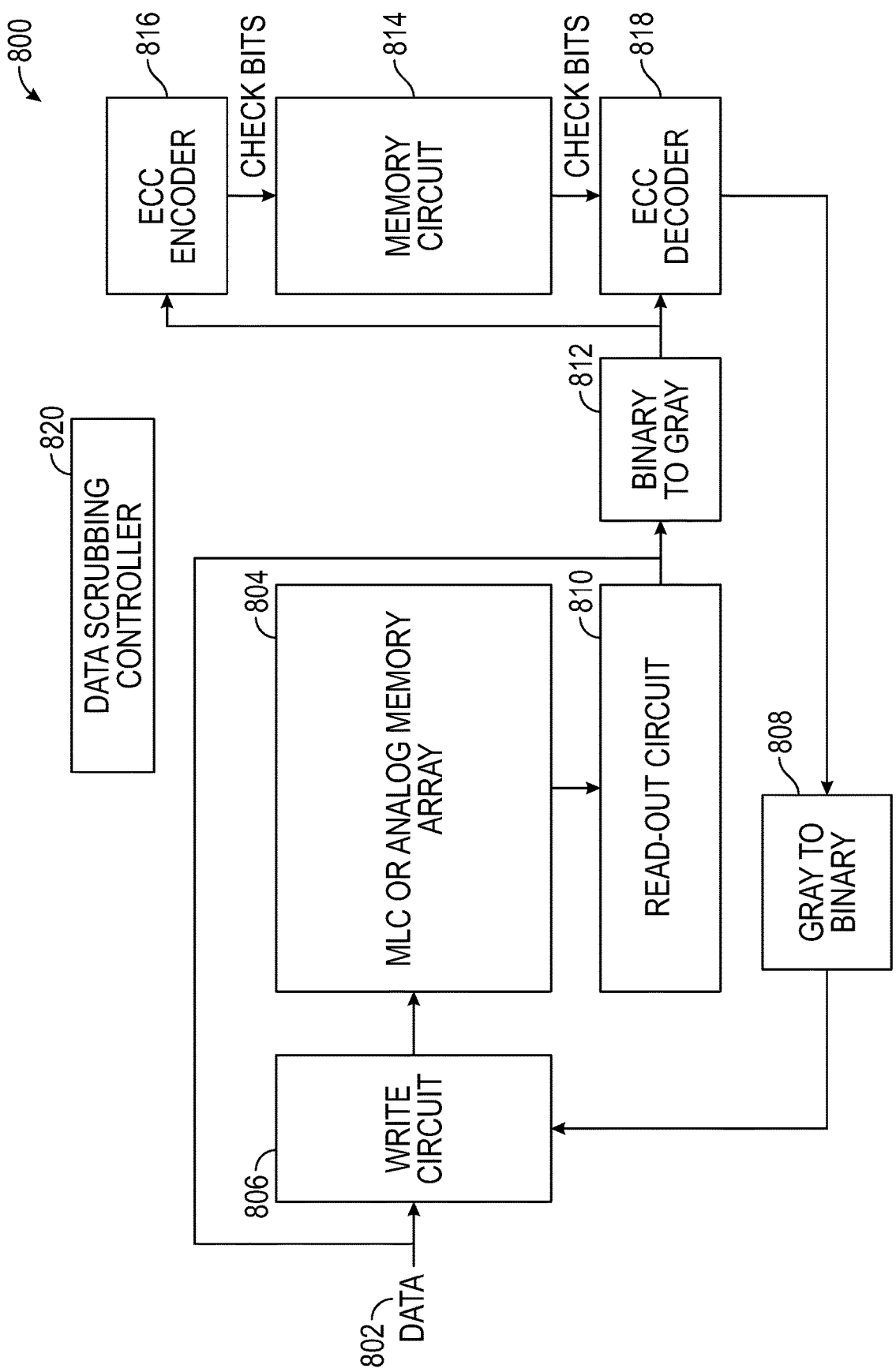
FIG. 8 illustrates a memory system, in accordance with an embodiment.

FIG. 8 illustrates a memory system, in accordance with an embodiment. The memory system 800 includes a data input 802, a multi-level cell (MLC) memory array 804, a write circuit 806 electrically coupled to the MLC memory array and the data input, a Gray code-to-binary decoder circuit 808 electrically coupled to the write circuit, a readout circuit 810 electrically coupled to the MLC memory array, a binary-to Gray code encoder circuit 812 electrically coupled to the readout circuit and the data input, a memory circuit 814 configured to store ECC check bits, an ECC encoder 816 electrically coupled to the memory circuit and binary-to Gray code encoder circuit, an ECC decoder 818 electrically coupled to the memory circuit and the Gray code-to-binary encoder circuit and configured to output recovered data, and a data scrubbing controller 820 configured to control data recovery in the memory system.

In some examples, Multi-level cell (MLC) devices may be used compute-in-memory operations by representing the matrix multiplicand with multiple states or a continuum of analog characteristics (e.g., in neural-network computing). In some embodiments, the MLC is an analog memory. The memory devices may exhibit drift during operation that may gradually change the value of the matrix multiplicand. As an exemplary advantage, the memory system 800 uses Gray code to effectively restore after the data experiences drift (e.g., the drift is corrected before a simple "read and recover" operation cannot correct the erroneous data); frequency of data re-programming may be reduced. Gray coding is a type of digital data representation in which neighboring states differ by one bit. This property advantageously ensures that small change in a device state changes only small number of bits, reducing requirement of the error correcting circuits and thereby reducing power and area of the error correction circuit associated with the memory.

In some embodiments, the memory circuit 814 is located on a different integrated circuit than the MLC memory 804. For example, the memory circuit, the ECC encoder circuit, and the ECC decoder circuit are included on a chip different than where MLC memory 804 is included. In some embodiments, the MLC memory 804 and the memory circuit 814 are included on a same chip. For example, the MLC memory 804 and the memory circuit 814 may be included in a same memory array. In some instances, the memory circuit may be located in a predetermined partition of the MLC memory array (e.g., the MLC memory array and the memory circuit are included in a same memory).

In some embodiments, the MLC memory array comprises a memory cell circuit having greater than two stable physical states. For example, the memory cell circuit may have eight stable states, and each stable state represents a number from zero to seven in binary. In some embodiments, the MLC memory array includes analog memory devices (e.g., an analog device configured to store a range of continuous values). For example, the memory cell circuit may be one selected from floating gate FLASH cell organized as a NOR cell, floating gate FLASH cell organized as a NAND cell, charge-trapping FLASH cells organized as a NOR cell, charge-trapping FLASH cells organized as a NAND cell, phase-change memory (PCM) cell, and resistive-memory (RRAM) cell.

In some embodiments, the ECC encoder and decoder use one selected from Hamming code, BCH code, Reed-Solomon code, and LDPC code. In some examples, the size of the check bits in the check-bit memory 814 is determined by the ECC method. In some embodiments, the readout circuit 810 includes an analog-to-digital converter (ADC).

In some embodiments, the data scrubbing controller 820 is substantially similar to the data scrubbing circuit 110, but is used for MLC memories. In some embodiments, the memory system 800 includes environmental disturbance sensor 140 and/or timer 150 to determine when data scrubbing should be initiated. In some examples, the data scrubbing controller is configured to initiate a data scrubbing operation at predetermined intervals (e.g., using the timer 150, as described herein), in response to a detection of an environmental disturbance (e.g., using the environmental disturbance sensor 140, as described herein), or in response to receiving a command from a host, as described herein. For example, the data may be read out periodically and data scrubbing is performed on the data to mitigate drift in the data.

Figure 9:
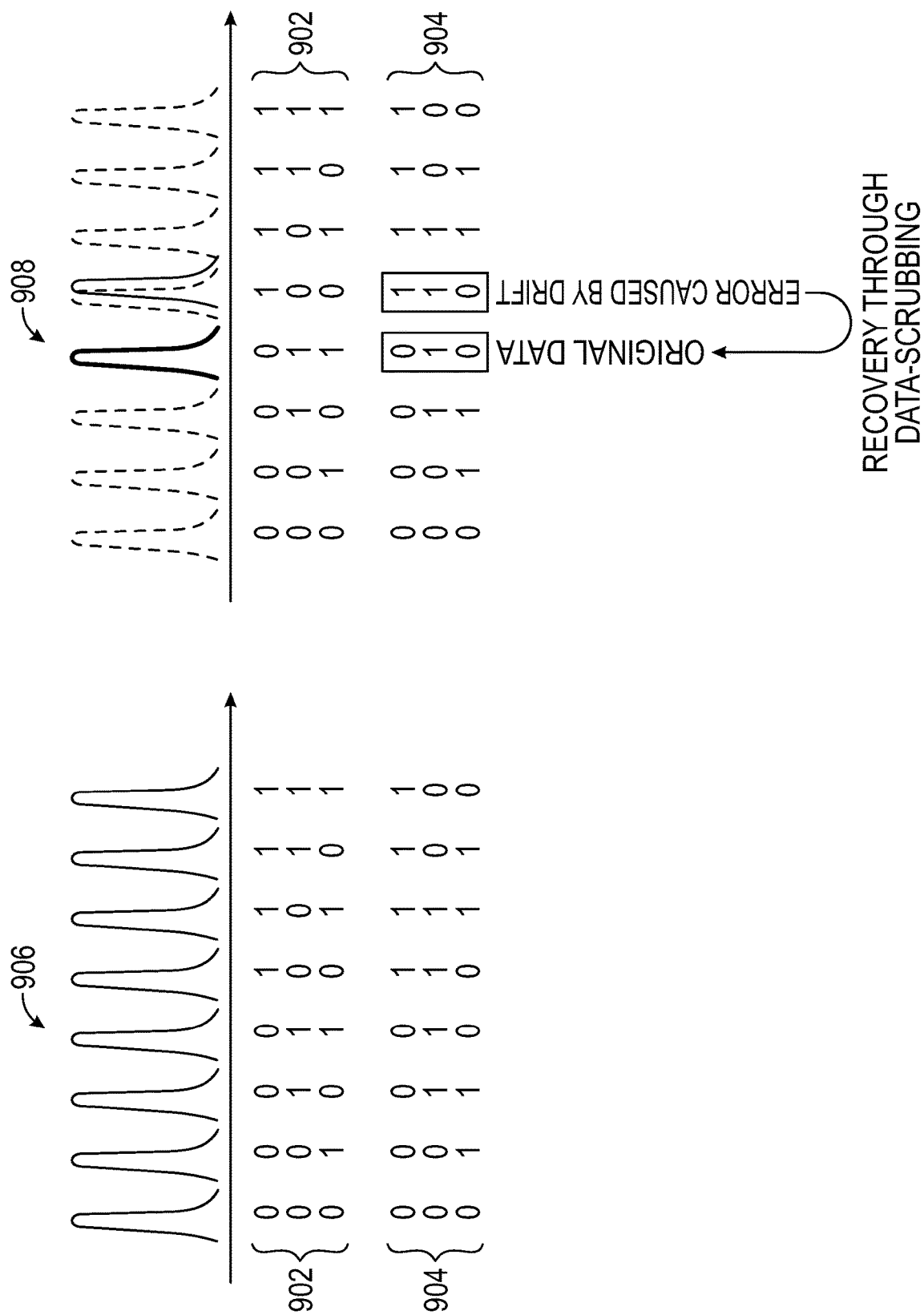
FIG. 9 illustrates data recovery, in accordance with an embodiment.

FIG. 9 illustrates data recovery, in accordance with an embodiment. Binary values 902 correspond to Gray code values 904; the top and bottom values of each row are mathematically equivalent. The curves 906 correspond to ideal ranges (e.g., voltages) of each discrete value that may be stored in a MLC memory. In some instances, the curves may deviate from the curves 906 due to non-idealities such as device drift. For example, the curve corresponding to the binary value "100" in curves 908 is shifted to the right due to drift; in these examples, data that include "100" may be incorrectly changed to "101." The ideal levels corresponding to "100" may be recovered using the memory system 800 or method 1000.

Figure 10:
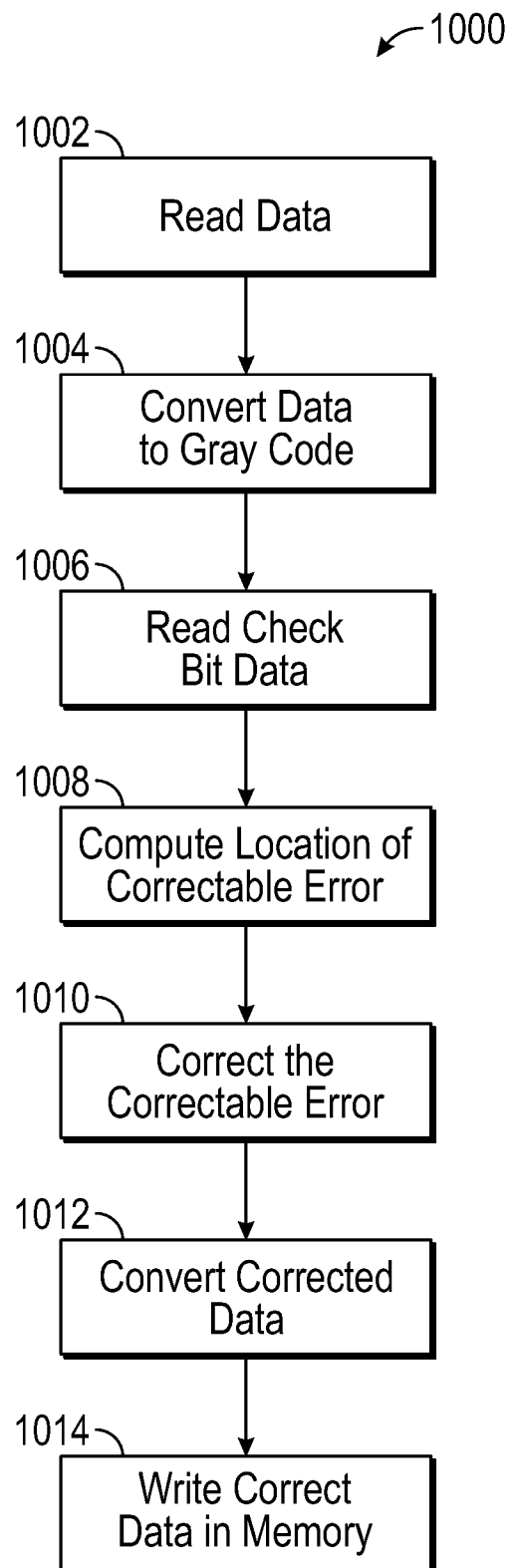
FIG. 10 illustrates a method of operating a memory system, in accordance with an embodiment.

FIG. 10 illustrates a method 1000 of operating a memory system, in accordance with an embodiment. The method 1000 includes step 1002, reading data from the MLC memory, the data represented in binary code or an analog value. For example, portions of or all data from the MLC memory 804 are read using the readout circuit 810. The data may be read and scrubbed sequentially or in parallel. When the data are read and scrubbed in parallel, the memory system 800 may include more than one non-memory array element (e.g., readout circuit, Gray code encoder/decoder, ECC memory, ECC encoder/decoder, write circuit) to enable concurrent data scrubbing of the MLC data.

In some embodiments, the method 1000 includes step 1004, converting the data to Gray code. For example, the binary to Gray code encoder circuit 812 converts the read data to Gray code.

In some embodiments, the method 1000 includes step 1006, reading corresponding check bit data from a memory circuit configured to store ECC check bits. For example, ECC check bits corresponding to the read data in the memory circuit 814 are read to perform data scrubbing operation on the read data.

In some embodiments, the method 1000 includes step 1008, computing a location of a correctable error in the data in Gray code. For example, after ECC operation is performed on the read data, the data scrubbing controller 820 computes locations (e.g., based on the decoded ECC word) of correctable errors based on results of the ECC operation.

In some embodiments, the method 1000 includes step 1010, correcting the correctable error in the data in Gray code. For example, the data scrubbing controller 820 corrects the correctable errors, in Gray code, based on the ECC method.

In some embodiments, the method 1000 includes step 1012, converting the corrected data to binary code or a corrected analog value. For example, the corrected Gray code data is converted back to a binary value (e.g., for MLC memories) or a corrected analog value (e.g., in analog memories) using the Gray code to binary decoder circuit 808.

In some embodiments, the method 1000 includes step 1014, writing, with a write circuit, the corrected data over the data in the MLC memory. For example, if an error is determined with the data being scrubbed, then the corrected and converted data are written to the memory 804 using the write circuit 806.

Although specific architectures and methods are described with respect to FIGS. 8-10, it is understood that the disclosed MLC or analog memories may utilize the binary error correction architectures and methods, as described with respect to FIGS. 1-7, to error-correct MLC or analog memories without departing from the scope of the disclosure.

Figure 11:
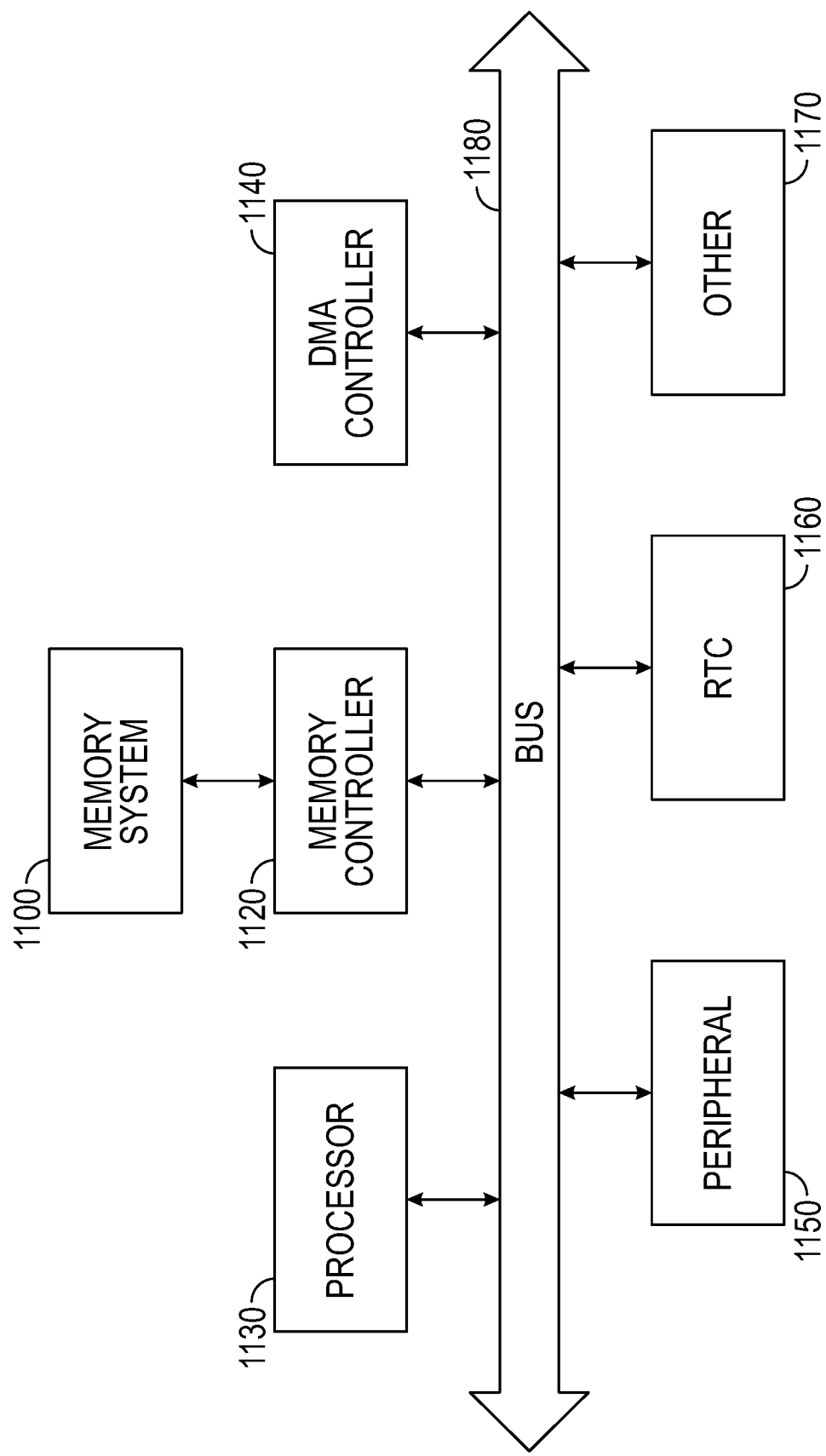
FIG. 11 illustrates a system including a memory system, in accordance with an embodiment.

FIG. 11 illustrates a system 1100 including a memory system, in accordance with an embodiment. System 1100 may include a memory system 1110 (e.g., memory system 100, 500, 800) electrically coupled to a memory controller 1120, a processor 1130, a DMA controller 1140, a peripheral interface 1150, a real-time-clock RTC 1160, and other circuits 1170. The exemplary elements of the system 1100 are electrically coupled a BUS 1180. In some embodiments, the system 1100 is a part of a portable electronic device, such as smartwatch or smartphone. In some embodiments, the system 1100 is a part of a machine learning system. In some embodiments, the system 1100 is a part a distributed information collection and processing network (e.g., a cloud, neural network).

In some embodiments, the memory system 1110 is included in one selected from an edge-AI system, a neural-network system in data centers, an internet-of-things system, an automotive electronics system, microcontroller system, a mobile communication system, a programmable computing system (e.g., FPGA), a hardware security system, a telematics system, a biomedical electronics device, a robot, and a drone.

Figure 12:
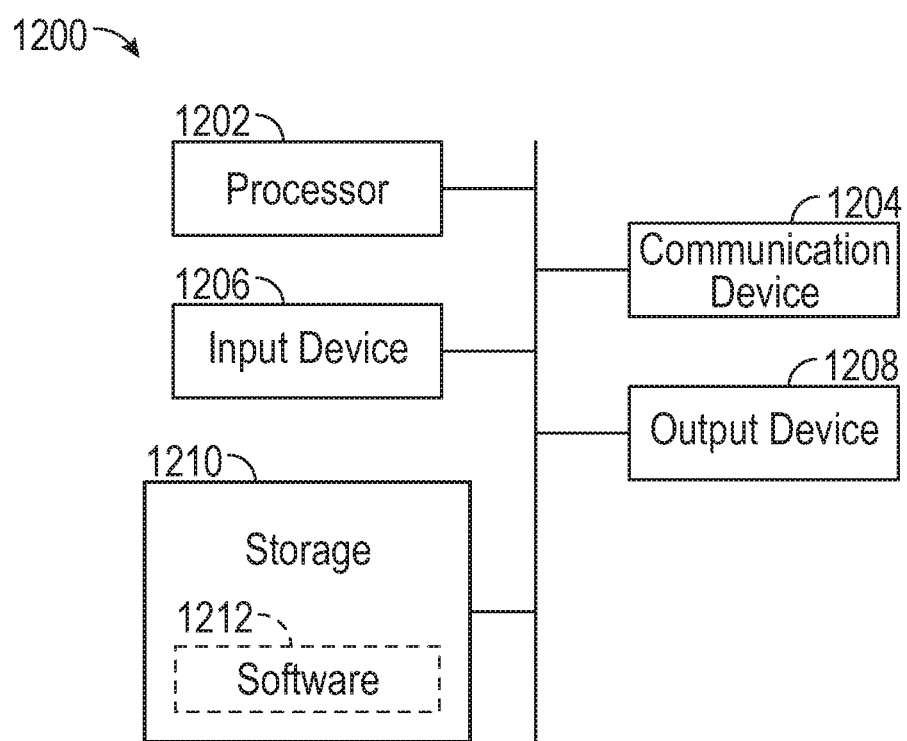
FIG. 12 illustrates an example of a computing device including a memory system, in accordance with an embodiment.

FIG. 12 illustrates an example of a computing device 1200, in accordance with an embodiment. In some embodiments, the device 1200 is configured to be coupled to the disclosed systems and is configured to perform the operational methods associated with the systems disclosed herein.

Device 1200 can be a host computer connected to a network. Device 2200 can be a client computer or a server. As shown in FIG. 12, device 1200 can be any suitable type of microprocessor-based device, such as a dedicated computing device, a personal computer, work station, server, handheld computing device (portable electronic device) such as a phone or tablet, an edge-AI device, or a neural network device. The device can include, for example, one or more of processors 1202, input device 1206, output device 1208, storage 1210, and communication device 1204. Input device 1206 and output device 1208 can generally correspond to those described above and can either be connectable or integrated with the computer.

Input device 1206 can be any suitable device that provides input, such as a camera sensor, touchscreen, keyboard or keypad, mouse, or voice-recognition device. Output device 1208 can be any suitable device that provides output, such as an illuminator, a touchscreen, haptics device, or speaker.

Storage 1210 can be any suitable device that provides storage, such as an electrical, magnetic, or optical memory including a RAM, cache, hard drive, or removable storage disk. In some examples, the storage 1210 includes memory system 100, 500, or 800. Communication device 1204 can include any suitable device capable of transmitting and receiving signals over a network, such as a network interface chip or device. The components of the computer can be connected in any suitable manner, such as via a physical bus, or wirelessly.

Software 1212, which can be stored in storage 1210 and executed by processor 1210, can include, for example, the programming that embodies the functionality of the present disclosure (e.g., as embodied in the devices described above).

Software 1212 can also be stored and/or transported within any non-transitory, computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 1210, that can contain or store programming for use by or in connection with an instruction-execution system, apparatus, or device.

Software 1212 can also be propagated within any transport medium for use by or in connection with an instruction-execution system, apparatus, or device, such as those described above, that can fetch instructions associated with the software from the instruction-execution system, apparatus, or device and execute the instructions. In the context of this disclosure, a transport medium can be any medium that can communicate, propagate, or transport programming for use by or in connection with an instruction-execution system, apparatus, or device. The transport readable medium can include, but is not limited to, an electronic, magnetic, optical, electromagnetic, or infrared wired or wireless propagation medium.

Device 1200 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 1200 can implement any operating system suitable for operating on the network. Software 1212 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

In one aspect, a memory system comprises: a data memory; an ECC memory; and a data scrubbing circuit electrically coupled to the ECC memory and the data memory.

In some aspects of the above memory system, the data scrubbing circuit is configured to, in response to receiving a scrub data command, correct an error in the data memory.

In some aspects of the above memory systems, a code word length used to correct the error is longer than a word length used during normal access of the data memory In some aspects of the above memory systems, the data scrubbing circuit comprises a data buffer, a data scrubbing controller, an ECC encoding circuit, and an ECC decoding circuit.

In some aspects of the above memory systems, the data scrubbing circuit is configured to correct the error in the data memory while the data memory is concurrently accessed.

In some aspects of the above memory systems, the memory system further comprises an environmental disturbance sensor configured to detect an environmental condition, and wherein the data scrubbing circuit generates a scrub data command based on the detected environmental condition.

In some aspects of the above memory systems, the environmental condition includes at least one of a temperature and a magnetic field.

In some aspects of the above memory systems, the data scrubbing circuit is configured to detect change in known data and generate a scrub data command based on the detection of the change.

In some aspects of the above memory systems, the memory system further comprises a timer circuit configured to: track a time lapsed; and determine whether the time lapsed is greater than a timing threshold, and the scrub data command is generated in accordance with the determination that the time lapsed is greater than the timing threshold.

In some aspects of the above memory systems, the ECC memory includes a plurality of partitions, and the data memory includes a plurality of ranges of memory addresses, each partition corresponding to a range of memory addresses in the data memory.

In some aspects of the above memory systems, the ECC memory includes a partition having a number of ECC bits, and the number of ECC bits is based on an ECC encoding method associated with a data scrubbing algorithm.

In some aspects of the above memory systems, the ECC memory includes a set of registers, wherein: each register corresponds to an ECC code word, each ECC code word corresponds to a section in the data memory, and each register stores a state of the section.

In some aspects of the above memory systems, at least one selected from the data memory and the ECC memory comprises magnetic random-access memory (MRAM).

In some aspects of the above memory systems, at least one selected from the data memory and the ECC memory include a memory unit cell including a magnetic tunnel junction (MTJ) having a property selected from reduced dimension, reduced coercive field, reduced magnetic anisotropy, and reduced saturation magnetization compared to a memory unit cell having a bit error rate between $10^{-12}$ and $10^{-2}$.

In some aspects of the above memory systems, the MJT has two properties selected from reduced dimension, reduced coercive field, reduced magnetic anisotropy, and reduced saturation magnetization compared to a memory unit cell having a bit error rate between $10^{-12}$ and $10^{-2}$.

In some aspects of the above memory systems, the data memory includes static random-access memory (SRAM), dynamic random-access memory (DRAM), or embedded DRAM (eDRAM).

In some aspects of the above memory systems, the data scrubbing circuit or a host is configured to determine whether the data memory is protected, and the ECC memory is configured to: in accordance with a determination that the data memory is protected, store ECC check-bits; and in accordance with a determination that the data memory is not protected, store computing data.

In some aspects of the above memory systems, the data memory and the ECC memory are included in different memory circuits.

In some aspects of the above memory systems, the data memory and the ECC memory are included in a same memory circuit.

In some aspects of the above memory systems, the memory system is electrically coupled to a host device.

In some aspects of the above memory systems, the data memory and the ECC memory include a memory unit cell including a MTJ having a size between 20 nm and 200 nm and a MOS transistor having a width-to-length ratio between 1 and 200.

In some aspects of the above memory systems, the data scrubbing circuit is configured to: receive a protect command for data; and in response to receiving the protect command, for each data word in the data to be protected: identify an address for a data code word associated with the data word; determine, based on the address, whether the data word is in a data memory; in response to determining that the data word is in the data memory, read the data word from the data memory; in response to determining that the data word is not in the data memory: receive the data word; and write the data word to the data memory; perform ECC encoding computation on the data word; generate the data code word based on the ECC encoding computation; write the data code word to the data memory at the address; generate ECC check bits based on the ECC encoding computation; and write the generated ECC check bits to a corresponding partition in the ECC memory.

In some aspects of the above memory systems, the data scrubbing circuit is configured to: receive a scrub data command; in response to receiving the scrub data command, for each data word to be scrubbed: identify: a starting address for a data code word, and a corresponding ECC memory partition; read a data word associated with the starting address from a data memory; read ECC check bits associated with the corresponding ECC memory partition from an ECC memory; perform ECC decoding computation based on the data word and ECC check bits; determine whether the data word includes an error based on the ECC decoding computation; in response to determining that the data word includes the error, replace error bits with correctable error bits in the data word, wherein the data word including the correctable error bits is a scrubbed data word; in response to determining that the data word does not include the error, forgo replacing the error bits with the correctable error bits in the data word, wherein the data word is the scrubbed data word; determine whether the scrubbed data word is requested by a host; in response to determining that the scrubbed data is requested by the host, output the scrubbed data word to a memory controller electrically coupled to the host; and in response to determining that the scrubbed data is not requested by the host, forgo outputting the scrubbed data word to the memory controller.

In one aspect, a method of operating a memory system, the memory system comprising: a data memory; an ECC memory; and a data scrubbing circuit electrically coupled to the ECC memory and the data memory, the method comprises: in response to receiving a scrub data command, correcting, using the data scrubbing circuit, an error in the data memory.

In some aspects of the above method, a code word length used to correct the error is longer than a word length used during normal access of the data memory.

In some aspects of the above methods, the data scrubbing circuit comprises a data buffer, a data scrubbing controller, an ECC encoding circuit, and an ECC decoding circuit.

In some aspects of the above methods, the method further comprises concurrently accessing the data memory while correcting the error in the data memory.

In some aspects of the above methods, the method further comprises detecting an environmental condition, using an environmental disturbance sensor; and generating the scrub data command based on the detected environmental condition.

In some aspects of the above methods, the environmental condition includes at least one of a temperature and a magnetic field.

In some aspects of the above methods, the method further comprises detecting change in known data; and generating the scrub data command based on the detection of the change.

In some aspects of the above methods, the method further comprises tracking a time lapsed; determining whether the time lapsed is greater than a timing threshold, and generating the scrub data command in accordance with the determination that the time lapsed is greater than the timing threshold.

In some aspects of the above methods, the ECC memory includes a plurality of partitions, and the data memory includes a plurality of ranges of memory addresses, each partition corresponding to a range of memory addresses in the data memory.

In some aspects of the above methods, the ECC memory includes a partition having a number of ECC bits associated with a data scrubbing algorithm, the method further comprising performing an ECC encoding method using the number of ECC bits.

In some aspects of the above methods, the ECC memory includes a set of registers, wherein: each register corresponds to an ECC code word, each ECC code word corresponds to a section in the data memory, and each register stores a state of the section.

In some aspects of the above methods, at least one selected from the data memory and the ECC memory comprises magnetic random-access memory (MRAM).

In some aspects of the above methods, at least one selected from the data memory and the ECC memory include a memory unit cell including a magnetic tunnel junction (MTJ) having a property selected from reduced dimension, reduced coercive field, reduced magnetic anisotropy, and reduced saturation magnetization compared to a memory unit cell having a bit error rate between $10^{-12}$ and $10^{-2}$.

In some aspects of the above methods, the MJT has two properties selected from reduced dimension, reduced coercive field, reduced magnetic anisotropy, and reduced saturation magnetization compared to a memory unit cell having a bit error rate between $10^{-12}$ and $10^{-2}$.

In some aspects of the above methods, the data memory includes static random-access memory (SRAM), dynamic random-access memory (DRAM), or embedded DRAM (eDRAM).

In some aspects of the above methods, the method further comprises determining whether the data memory is protected; in accordance with a determination that the data memory is protected, storing ECC check-bits in the ECC memory; and in accordance with a determination that the data memory is not protected, store computing data in the ECC memory.

In some aspects of the above methods, the data memory and the ECC memory are included in different memory circuits.

In some aspects of the above methods, the data memory and the ECC memory are included in a same memory circuit.

In some aspects of the above methods, the memory system is electrically coupled to a host device.

In some aspects of the above methods, the data memory and the ECC memory include a memory unit cell including a MTJ having a size between 20 nm and 200 nm and a MOS transistor having a width-to-length ratio between 1 and 200.

In some aspects of the above methods, the method further comprises receiving a protect command for data; and in response to receiving the protect command, for each data word in the data to be protected: identifying an address for a data code word associated with the data word; determining, based on the address, whether the data word is in a data memory; in response to determining that the data word is in the data memory, reading the data word from the data memory; in response to determining that the data word is not in the data memory: receiving the data word from; and writing the data word to the data memory; performing ECC encoding computation on the data word; generating the data code word based on the ECC encoding computation; writing the data code word to the data memory at the address; generating ECC check bits based on the ECC encoding computation; and writing the generated ECC check bits to a corresponding partition in an ECC memory.

In some aspects of the above methods, the method further comprises in response to receiving the scrub data command, for each data word to be scrubbed: identifying: a starting address for a data code word, and a corresponding ECC memory partition; reading a data word associated with the starting address from a data memory; reading ECC check bits associated with the corresponding ECC memory partition from an ECC memory; performing ECC decoding computation based on the data word and ECC check bits; determining whether the data word includes an error based on the ECC decoding computation; in response to determining that the data word includes the error, replacing error bits with correctable error bits in the data word, wherein the data word including the correctable error bits is a scrubbed data word; in response to determining that the data word does not include the error, forgoing replacing the error bits with the correctable error bits in the data word, wherein the data word is the scrubbed data word; determining whether the scrubbed data word is requested by a host; in response to determining that the scrubbed data is requested by the host, outputting the scrubbed data word to a memory controller electrically coupled to the host; and in response to determining that the scrubbed data is not requested by the host, forgoing outputting the scrubbed data word to the memory controller.

In some aspects of the above memory systems, the memory system is included in one selected from an edge-AI system, a neural-network system in data centers, an internet-of-things system, an automotive electronics system, microcontroller system, a mobile communication system, a programmable computing system, a hardware security system, a telematics system, a biomedical electronics device, a robot, and a drone.

In one aspect, a memory system comprises: a first memory circuit associated with a first bit error rate; a second memory circuit associated with a second bit error rate, wherein the first bit error rate is greater than the second bit error rate; and a data word stored in the first and second memory circuits, wherein: the data word includes a first partition associated with the first bit error rate and a second partition associated with the second bit error rate, the first partition of the data word is stored in the first memory circuit, and the second partition of the data word is stored in the second memory circuit.

In some aspects of the above memory system, the memory system further comprises a data scrubbing circuit electrically coupled to the first and second memory circuits, wherein: the data scrubbing circuit controls the first memory circuit to reduce the first error rate to a third error rate, the data scrubbing circuit controls the second memory circuit to reduce the second error rate to a fourth error rate, and the reduction of the first bit error rate is greater than the reduction of the second bit error rate.

In some aspects of the above memory systems, the first memory circuit includes a first memory unit cell including a first magnetic tunnel junction (MTJ) having a first size and a first MOS transistor having a first channel width to channel length (W/L) ratio, the second memory circuit includes a second memory unit cell including a second MTJ having a second size and a second MOS transistor having a second W/L ratio, the first size is larger than the second size, and the first W/L ratio is larger than the second W/L ratio.

In some aspects of the above memory systems, the first memory circuit includes a memory unit cell including a MTJ having a size between 40 nm and 200 nm and a MOS transistor having a W/L ratio between 2 and 200.

In some aspects of the above memory systems, the second memory circuit includes a memory unit cell including a MTJ having a size between 20 nm and 100 nm and a MOS transistor having a W/L ratio between 1 and 100.

In some aspects of the above memory systems, the first memory circuit uses a first read voltage, a first sensing time, and a first word-line (WL) voltage, the second memory circuit uses a second read voltage, a second sensing time, and a second WL voltage, the first read voltage is greater than the second read voltage, the first sensing time is greater than the second sensing time, and the first WL voltage is greater than the second WL voltage.

In some aspects of the above memory systems, the first memory circuit uses a first write voltage, a first write time, and a first WL voltage, the second memory circuit uses a second write voltage, a second write time, and a second WL voltage, the first write voltage is greater than the second write voltage, the first write time is greater than the write sensing time, and the first WL voltage is greater than the second WL voltage.

In some aspects of the above memory systems, in a floating point format, the first partition includes a sign bit, exponent bits, and higher order part of mantissa bits.

In some aspects of the above memory systems, in an integer format, the first partition includes a sign bit and higher order bits.

In some aspects of the above memory systems, in a floating point format, the second partition includes a lower order part of mantissa bits.

In some aspects of the above memory systems, in an integer format, the second partition includes lower order bits.

In one aspect, a method of operating a memory system, the memory system comprising a first memory circuit and a second memory circuit, the method comprises: determining a first partition of a data word to be stored in the memory system based on a first bit error rate; determining a second partition of the data word to be stored in the memory system based on a second bit error rate, the first bit error rate greater than the second bit error rate; storing the first partition of a data word in a first memory circuit; and storing the second partition of a data word in a second memory circuit, wherein: the first memory circuit is associated with the first bit error rate, and the second memory circuit is associated with the second bit error rate.

In some aspects of the above method, the method further comprises controlling the first memory circuit to reduce the first error rate to a third error rate; and controlling the second memory circuit to reduce the second error rate to a fourth error rate, wherein the reduction of the first bit error rate is greater than the reduction of the second bit error rate.

In some aspects of the above methods, the first memory circuit includes a first memory unit cell including a first MTJ having a first size and a first MOS transistor having a first channel W/L ratio, the second memory circuit includes a second memory unit cell including a second MTJ having a second size and a second MOS transistor having a second W/L ratio, the first size is larger than the second size, and the first W/L ratio is larger than the second W/L ratio.

In some aspects of the above methods, the first memory circuit includes a memory unit cell including a MTJ having a size between 40 nm and 200 nm and a MOS transistor having a W/L ratio between 2 and 200.

In some aspects of the above methods, the second memory circuit includes a memory unit cell including a MTJ having a size between 20 nm and 100 nm and a MOS transistor having a W/L ratio between 1 and 100.

In some aspects of the above methods, the method further comprises using, in the first memory circuit, a first read voltage, a first sensing time, and a first WL voltage; and using, in the second memory circuit, a second read voltage, a second sensing time, and a second WL voltage, wherein: the first read voltage is greater than the second read voltage, the first sensing time is greater than the second sensing time, and the first WL voltage is greater than the second WL voltage.

In some aspects of the above methods, the method further comprises using, in the first memory circuit, a first write voltage, a first write time, and a first WL voltage; and using, in the second memory circuit, a second write voltage, a second write time, and a second WL voltage, wherein: the first write voltage is greater than the second write voltage, the first write time is greater than the write sensing time, and the first WL voltage is greater than the second WL voltage.

In some aspects of the above methods, in a floating point format, the first partition includes a sign bit, exponent bits, and higher order part of mantissa bits.

In some aspects of the above methods, in an integer format, the first partition includes a sign bit and higher order bits.

In some aspects of the above methods, in a floating point format, the second partition includes a lower order part of mantissa bits.

In some aspects of the above methods, in an integer format, the second partition includes lower order bits.

In some aspects of the above memory systems, the memory system is included in one selected from an edge-AI system, a neural-network system in data centers, an internet-of-things system, an automotive electronics system, microcontroller system, a mobile communication system, a programmable computing system, a hardware security system, a telematics system, a biomedical electronics device, a robot, and a drone.

In one aspect, a memory system comprises: a data input; a multi-level cell (MLC) array; a write circuit electrically coupled to the MLC array and the data input; a Gray code-to-binary decoder circuit electrically coupled to the write circuit; a readout circuit electrically coupled to the MLC array; a binary-to Gray code encoder circuit electrically coupled to the readout circuit and the data input; a memory circuit configured to store ECC check bits; an ECC encoder electrically coupled to the memory circuit and binary-to Gray code encoder circuit; an ECC decoder electrically coupled to the memory circuit and the Gray code-to-binary encoder circuit and configured to output recovered data; and a data scrubbing controller configured to control data recovery in the memory system.

In some aspects of the above memory system, the MLC array comprises a memory cell circuit having greater than two stable physical states.

In some aspects of the above memory systems, the memory cell circuit is one selected from floating gate FLASH cell organized as a NOR cell, floating gate FLASH cell organized as a NAND cell, charge-trapping FLASH cells organized as a NOR cell, charge-trapping FLASH cells organized as a NAND cell, phase-change memory (PCM) cell, and resistive-memory (RRAM) cell.

In some aspects of the above memory systems, the ECC encoder and decoder use in one selected from Hamming code, BCH code, Reed-Solomon code, and LDPC code.

In some aspects of the above memory systems, the memory circuit is located on a different integrated circuit than the MLC array.

In some aspects of the above memory systems, the memory circuit is located in a predetermined partition of the MLC array.

In some aspects of the above memory systems, the data scrubbing controller is configured to initiate a data scrubbing operation at predetermined intervals, in response to a detection of an environmental disturbance, or in response to receiving a command from a host.

In one aspect, a method of data-scrubbing a MLC comprises: reading data from the MLC, the data represented in binary code or an analog value; converting the data to Gray code; reading corresponding check bit data from a memory circuit configured to store ECC check bits; computing a location of a correctable error in the data in Gray code; correcting the correctable error in the data in Gray code; converting the corrected data to binary code or a corrected analog value; and writing, with a write circuit, the corrected data over the data in the MLC.

In some aspects of the above method, the MLC array comprises a memory cell circuit having greater than two stable physical states.

In some aspects of the above methods, the memory cell circuit is one selected from floating gate FLASH cell organized as a NOR cell, floating gate FLASH cell organized as a NAND cell, charge-trapping FLASH cells organized as a NOR cell, charge-trapping FLASH cells organized as a NAND cell, phase-change memory (PCM) cell, and resistive-memory (RRAM) cell.

In some aspects of the above methods, the method further comprises ECC encoding and decoding in one selected from Hamming code, BCH code, Reed-Solomon code, and LDPC code.

In some aspects of the above methods, the memory circuit is located on a different integrated circuit than the MLC array.

In some aspects of the above methods, the memory circuit is located in a predetermined partition of the MLC array.

In some aspects of the above methods, the method further comprises initiating a data scrubbing operation at predetermined intervals, in response to a detection of an environmental disturbance, or in response to receiving a command from a host.

In some aspects of the above memory systems, the memory system is included in one selected from an edge-AI system, a neural-network system in data centers, an internet-of-things system, an automotive electronics system, microcontroller system, a mobile communication system, a programmable computing system, a hardware security system, a telematics system, a biomedical electronics device, a robot, and a drone.

Although "electrically coupled" and "coupled" are used to describe the electrical connections between two elements of the readout circuit in this disclosure, it is understood that the electrical connections do not necessarily need direct connection between the terminals of the components being coupled together. Different combinations and connections of the recited components can achieve a constant current and adjustable bias voltage readout circuit without departing from the scope of this disclosure. For example, electrical routing connects between the terminals of the components being electrically coupled together. In another example, a closed (conducting) switch is connected between the terminals of the components being coupled together. In yet another example, additional elements connect between the terminals of the components being coupled together without affecting the constant current characteristics of the circuit. For example, buffers, amplifiers, and passive circuit elements can be added without affecting the characteristics of the readout circuit and departing from the scope of this disclosure.

In some embodiments, two electrically coupled components may be topologically coupled. As used herein, two components are "topologically coupled" if they provide an electrical influence on one another within a topology or a same part of a topology. For example, the reference sensor and the first current source of the disclosed readout circuits are electrically coupled on a same reference branch of the readout circuit.

Similarly, although "electrically uncoupled" is used to describe electrical disconnects between two elements of the readout circuit in this disclosure, it is understood that electrical disconnects do not necessarily need to be physically open between the terminals of the components being switched. It is also understood that "uncoupled" is not limited to mean prevention of electrical energy transfer between two elements. For example, high-impedance elements are connected between the terminals of the components being uncoupled. In another example, an opened (non-conducting) switch is connected between the terminals of the components being uncoupled, effectively uncoupling the components.

Generally, as used herein, the term "substantially" is used to describe element(s) or quantit(ies) ideally having an exact quality (e.g., fixed, the same, uniformed, equal, similar, proportional), but practically having qualities functionally equivalent to the exact quality. For example, an element or quantity is described as being substantially fixed or uniformed can deviate from the fixed or uniformed value, as long as the deviation is within a tolerance of the system (e.g., accuracy requirements, etc.). As another example, two elements or quantities described as being substantially equal can be approximately equal, as long as the difference is within a tolerance that does not functionally affect a system's operation.

Likewise, although some elements or quantities are described in an absolute sense without the term "substantially", it is understood that these elements and quantities can have qualities that are functionally equivalent to the absolute descriptions. For example, in some embodiments, a ratio is described as being one. However, it is understood that the ratio can be greater or less than one, as long as the ratio is within a tolerance of the system (e.g., accuracy requirements, etc.).

As used herein, "substantially the same" sensors produce a similar response to a given stimulus. For example, "substantially the same" bolometers produce a similar resistance change for a given temperature change.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A memory system, comprising:
a data memory;
an ECC memory; and
a data scrubbing circuit electrically coupled to the ECC memory and the data memory, wherein (1) the data memory, (2) the ECC memory, or (3) both the data memory and the ECC memory comprise magnetic random-access memory (MRAM),
wherein the data scrubbing circuit is configured to:
receive a protect command for data; and
in response to receiving the protect command, for each data word in the data to be protected:
perform ECC encoding computation on the data word;
generate ECC check bits based on the ECC encoding computation; and
write the generated ECC check bits to a corresponding partition in the ECC memory.

2. The memory system of claim 1, wherein a code word length used to correct the error is longer than a word length used during normal access of the data memory.

3. The memory system of claim 1, wherein the data scrubbing circuit is configured to correct the error in the data memory while the data memory is concurrently accessed.

4. The memory system of claim 1, further comprising an environmental disturbance sensor configured to detect an environmental condition, and wherein the data scrubbing circuit generates a scrub data command based on the detected environmental condition.

5. The memory system of claim 4, wherein the environmental condition includes at least one of a temperature and a magnetic field.

6. The memory system of claim 1, wherein the data scrubbing circuit is configured to detect change in known data and generate a scrub data command based on the detection of the change.

7. The memory system of claim 1, wherein:
the ECC memory includes a set of registers, wherein:
each register corresponds to an ECC code word,
each ECC code word corresponds to a section in the data memory, and
each register stores a state of the section.

8. The memory system of claim 1, wherein at least one selected from the data memory and the ECC memory include a memory unit cell including a magnetic tunnel junction (MTJ) having a property selected from reduced dimension, reduced coercive field, reduced magnetic anisotropy, and reduced saturation magnetization compared to a memory unit cell having a bit error rate between $10^{-12}$ and $10^{-2}$.

9. The memory system of claim 8, wherein the MJT has two properties selected from reduced dimension, reduced coercive field, reduced magnetic anisotropy, and reduced saturation magnetization compared to a memory unit cell having a bit error rate between $10^{-12}$ and $10^{-2}$.

10. The memory system of claim 1, wherein:
the data scrubbing circuit or a host is configured to determine whether the data memory is protected, and
the ECC memory is configured to:
in accordance with a determination that the data memory is protected, store ECC check-bits; and
in accordance with a determination that the data memory is not protected, store computing data.

11. The memory system of claim 1, wherein the data scrubbing circuit is further configured to:
in response to receiving the protect command, for each data word in the data to be protected:
identify an address for a data code word associated with the data word;
determine, based on the address, whether the data word is in a data memory;

in accordance with a determination that the data word is in the data memory, read the data word from the data memory;
in accordance with a determination that the data word is not in the data memory:
receive the data word; and
write the data word to the data memory;
generate the data code word based on the ECC encoding computation; and
write the data code word to the data memory at the address.

12. A method of operating a memory system, the memory system comprising:
a data memory;
an ECC memory; and
a data scrubbing circuit electrically coupled to the ECC memory and the data memory, the method comprising:
in response to receiving a scrub data command, correcting, using the data scrubbing circuit, an error in the data memory;
receiving a protect command for data; and
in response to receiving the protect command, for each data word in the data to be protected:
performing ECC encoding computation on the data word;
generating ECC check bits based on the ECC encoding computation; and
writing the generated ECC check bits to a corresponding partition in an ECC memory.

13. The method of claim 12, wherein a code word length used to correct the error is longer than a word length used during normal access of the data memory.

14. The method of claim 12, further comprising concurrently accessing the data memory while correcting the error in the data memory.

15. The method of claim 12, further comprising:
detecting an environmental condition, using an environmental disturbance sensor; and
generating the scrub data command based on the detected environmental condition.

16. The method of claim 12, further comprising:
detecting change in known data; and
generating the scrub data command based on the detection of the change.

17. The method of claim 12, wherein:
the ECC memory includes a set of registers, wherein:
each register corresponds to an ECC code word,
each ECC code word corresponds to a section in the data memory, and
each register stores a state of the section.

18. The method of claim 12, wherein at least one selected from the data memory and the ECC memory comprises magnetic random-access memory (MRAM).

19. The method of claim 12, further comprising:
in response to receiving the protect command, for each data word in the data to be protected:
identifying an address for a data code word associated with the data word;
determining, based on the address, whether the data word is in a data memory;
in response to determining that the data word is in the data memory, reading the data word from the data memory;
in response to determining that the data word is not in the data memory:
receiving the data word from; and
writing the data word to the data memory;
generating the data code word based on the ECC encoding computation;
writing the data code word to the data memory at the address.

20. A method of operating a memory system, the memory system comprising:
a data memory;
an ECC memory; and
a data scrubbing circuit electrically coupled to the ECC memory and the data memory, the method comprising:
in response to receiving a scrub data command, correcting, using the data scrubbing circuit, an error in the data memory;
in response to receiving the scrub data command, for each data word to be scrubbed:
identifying:
a starting address for a data code word, and
a corresponding ECC memory partition;
reading a data word associated with the starting address from a data memory;
reading ECC check bits associated with the corresponding ECC memory partition from an ECC memory;
performing ECC decoding computation based on the data word and ECC check bits;
determining whether the data word includes an error based on the ECC decoding computation;
in accordance with a determination that the data word includes the error, replacing error bits with correctable error bits in the data word, wherein the data word including the correctable error bits is a scrubbed data word.

21. The method of claim 20, further comprising:
in response to receiving the scrub data command, for each data word to be scrubbed:
in response to determining that the data word does not include the error, forgoing replacing the error bits with the correctable error bits in the data word, wherein the data word is the scrubbed data word;
determining whether the scrubbed data word is requested by a host;
in response to determining that the scrubbed data is requested by the host, outputting the scrubbed data word to a memory controller electrically coupled to the host; and
in response to determining that the scrubbed data is not requested by the host, forgoing outputting the scrubbed data word to the memory controller.

22. A memory system, comprising:
a data memory;
an ECC memory; and
a data scrubbing circuit electrically coupled to the ECC memory and the data memory, wherein (1) the data memory, (2) the ECC memory, or (3) both the data memory and the ECC memory comprise magnetic random-access memory (MRAM),
wherein the data scrubbing circuit is configured to:
receive a scrub data command; and
in response to receiving the scrub data command, for each data word to be scrubbed:
identify:
a starting address for a data code word, and
a corresponding ECC memory partition;
read a data word associated with the starting address from a data memory;

read ECC check bits associated with the corresponding ECC memory partition from an ECC memory;
perform ECC decoding computation based on the data word and ECC check bits;
determine whether the data word includes an error based on the ECC decoding computation; and
in accordance with a determination that the data word includes the error, replace error bits with correctable error bits in the data word, wherein the data word including the correctable error bits is a scrubbed data word.

23. The memory system of claim 22, wherein the data scrubbing circuit is further configured to:
in response to receiving the scrub data command, for each data word to be scrubbed:
in accordance with a determination that the data word does not include the error, forgo replacing the error bits with the correctable error bits in the data word, wherein the data word is the scrubbed data word;
determine whether the scrubbed data word is requested by a host;
in accordance with a determination that the scrubbed data is requested by the host, output the scrubbed data word to a memory controller electrically coupled to the host; and
in accordance with a determination that the scrubbed data is not requested by the host, forgo outputting the scrubbed data word to the memory controller.

* * * * *